(12) United States Patent
Campbell

(10) Patent No.: US 7,050,327 B2
(45) Date of Patent: May 23, 2006

(54) DIFFERENTIAL NEGATIVE RESISTANCE MEMORY

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/410,567

(22) Filed: Apr. 10, 2003

(65) Prior Publication Data

US 2004/0202016 A1    Oct. 14, 2004

(51) Int. Cl.
*G11C 11/00*     (2006.01)
(52) U.S. Cl. .................. 365/159; 365/100; 365/113; 365/163
(58) Field of Classification Search ............... 365/100, 365/113, 159, 163
See application file for complete search history.

(56) References Cited

U.S. PATENT DOCUMENTS

| | | | |
|---|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |

(Continued)

FOREIGN PATENT DOCUMENTS

JP     56126916     10/1981

(Continued)

OTHER PUBLICATIONS

Abdel-All, A.; Elshafie,A.; Elhawary, M.M., DC electric-field effect in bulk and thin-film Ge5As38Te57 chalcogenide glass, Vacuum 59 (2000) 845-853.

(Continued)

*Primary Examiner*—VanThu Nguyen
(74) *Attorney, Agent, or Firm*—Dickstein Shapiro Morin & Oshinsky LLP

(57) ABSTRACT

The invention relates to a DNR (differential negative resistance) exhibiting device that can be programmed to store information as readable current amplitudes and to methods of making such a device. The stored data is semi-volatile. Generally, information written to a device in accordance with the invention can maintain its memory for a matter of minutes, hours, or days before a refresh is necessary. The power requirements of the device are far reduced compared to DRAM. The memory function of the device is highly stable, repeatable, and predictable. The device can be produced in a variety of ways.

50 Claims, 23 Drawing Sheets

U.S. PATENT DOCUMENTS

| | | |
|---|---|---|
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,809,044 A | 2/1989 | Pryor et al. |
| 4,816,878 A | 3/1989 | Kano et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,608,231 A | 3/1997 | Ugajin et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A | 6/1998 | Kozicki et al. |
| 5,789,277 A | 8/1998 | Zahorik et al. |
| 5,815,008 A | 9/1998 | Williamson, III et al. |
| 5,825,046 A | 10/1998 | Czubatyj et al. |
| 5,841,150 A | 11/1998 | Gonzalez et al. |
| 5,846,889 A | 12/1998 | Harbison et al. |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,072,716 A | 6/2000 | Jacobson et al. |
| 6,077,729 A | 6/2000 | Harshfield |
| 6,084,796 A * | 7/2000 | Kozicki et al. ............ 365/153 |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,429,064 B1 | 8/2002 | Wicker |
| 6,437,383 B1 | 8/2002 | Xu |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowery et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowery |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |

| | | | |
|---|---|---|---|
| 2002/0168820 | A1 | 11/2002 | Kozicki |
| 2002/0190350 | A1 | 12/2002 | Kozicki |
| 2003/0001229 | A1 | 1/2003 | Moore et al. |
| 2003/0027416 | A1 | 2/2003 | Moore |
| 2003/0035314 | A1 | 2/2003 | Kozicki |
| 2003/0035315 | A1 | 2/2003 | Kozicki |
| 2003/0048744 | A1 | 3/2003 | Ovshinsky et al. |
| 2003/0156463 | A1* | 8/2003 | Casper et al. .......... 365/189.07 |
| 2003/0156468 | A1* | 8/2003 | Campbell et al. ........... 365/200 |
| 2003/0212724 | A1 | 11/2003 | Ovshinsky et al. |
| 2003/0212725 | A1 | 11/2003 | Ovshinsky et al. |
| 2004/0035401 | A1 | 2/2004 | Ramachandran et al. |
| 2004/0042259 | A1* | 3/2004 | Campbell et al. ........... 365/158 |

FOREIGN PATENT DOCUMENTS

| | | |
|---|---|---|
| WO | WO 97/48032 | 12/1997 |
| WO | WO 99/28914 | 6/1999 |
| WO | WO 00/48196 | 8/2000 |
| WO | WO 02/21542 | 3/2002 |

OTHER PUBLICATIONS

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi, M.A.; Labib, H.H.; Fouad, S.S.; El-Shazly, A.A., Electrical & thermal conductivity of the amorphous semiconductor GexSe1-x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu-As-Se compositions, J. Non-Cryst. Solids 11 (1972) 97-104.

Asokan, S.; Prasad, M.V.N.; Parthasarathy, G.; Gopal, E.S.R., Mechanical and chemical thresholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al-Al2O3-Ag2-xSe1+x thin film structures, Phys. Stat. Sol. (a) 74 (1982) 217-224.

Bondarev, V.N.; Pikhitsa, P.V., A dendrite model of current instability in RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17th (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As-Te-Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Dearnaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag-Ge-Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2-xSe1+x/n-Si diodes, Thin Solid Films 110 (1983) 107-113.

El Gharras, Z.; Bourahla, A.; Vautier, C., Role of photoinduced defects in amorphous GexSe1-x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliott, S.R., A unified mechanism for metal photodissolution in amorphous chalcogenide materials, J. Non-Cryst. Solids 130 (1991) 85-97.

Elliott, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80-x films, Thin Solid Films 376 (2000) 236-240.

Fadel, M., Switching phenomenon in evaporated Se-Ge-As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness threshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag-GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As-Se-Cu glasses, J. Apply. Phys. 54 (1983) 1950-1954.

Hajto, J.; Rose, M.J.; Osborne, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory switching phenomena in thin films of chalcogenide semiconductors, Vacuum 45 (1994) 459-462.

Hirose, Y.; Hirose, H., Polarity-dependent memory switching and behavior of Ag dendrite in Ag-photodoped amorphous As2S3 films, J. Appl. Phys. 47 (1976) 2767-2772.

Hong, K.S.; Speyer, R.F., Switching behavior in II-IV-V2 amorphous semiconductor systems, J. Non-Cryst. Solids 116 (1990) 191-200.

Hosokawa, S., Atomic and electronic structures of glassy GexSe1-x around the stiffness threshold composition, J. Optoelectronics and Advanced Materials 3 (2001) 199-214.

Hu, J.; Snell, A.J.; Hajto, J.; Owen, A.E., Constant current forming in Cr/p+a-/Si:H/V thin film devices, J. Non-Cryst. Solids 227-230 (1998) 1187-1191.

Hu, J.; Hajto, J.; Snell, A.J.; Owen, A.E.; Rose, M.J., Capacitance anomaly near the metal-non-metal transition in Cr-hydrogenated amorphous Si-V thin-film devices, Phil. Mag. B. 74 (1996) 37-50.

Hu, J.; Snell, A.J.; Hajto, J.; Owen, A.E., Current-induced instability in Cr-p+a-Si:H-V thin film devices, Phil. Mag. B 80 (2000) 29-43.

Iizima, S.; Sugi, M.; Kikuchi, M.; Tanaka, K., Electrical and thermal properties of semiconducting glasses As-Te-Ge, Solid State Comm. 8 (1970) 153-155.

Ishikawa, R.; Kikuchi, M., Photovoltaic study on the photo-enhanced diffusion of Ag in amorphous films of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before switching, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag-Ge-S and Ag-Ge-Se films and comparison of photoinduced and thermally induced phenomena of both system, J. Appl. Phys. 79 (1996) 9096-9104.

Kawaguchi, T.; Masui, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259-269.

Kluge, G.; Thomas, A.; Klabes, R.; Grotzschel, R., Silver photodiffusion in amorphous GexSe100-x, J. Non-Cryst. Solids 124 (1990) 186-193.

Kolobov, A.V., On the origin of p-type conductivity in amorphous chalcogenide, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hegab, N.A.; Abdel-Aziz, M.M., Memory switching in amorphous GeSeTI chalcogenide semiconductor films, Thin Solid Films 240 (1994) 143-146.

Lakshminarayan, K.N.; Srivastava, K.K.; Panwar, O.S.; Dumar, A., Amorphous semiconductor devices: memory and switching mechanism, J. Instn Electronics & Telecom, Engrs 27 (1981) 16-19.

Lal, M.; Goyal, N., Chemical bond approach to study the memory and threshold switching chalcogenide glasses, Indian Journal of pure & appl. phys. 29 (1991) 303-304.

Leimer, F.; Stotzel, H.; Kottwitz, A., Isothermal electrical polarisation of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1-x glass, Appl. Phys. Lett. 46 (1985) 543-545.

Matsushita, T.; Yamagami, T.; Okuda, M., Polarized memory effect observed on Se-SnO2 System, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2-V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni,Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge-Se glasses used in programmable metallization cell devices, J. Non-Cryst. Solids 299-302 (2002) 1023-1027.

Mitkova, M.; Wang. Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1-x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transistions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky, S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmable nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory switching in thin films of the chalcogenide system Ge-As-Se, Appl. Phys. Lett. 19 (1971) 221-223.

Popescu, C., The effect of local non-uniformities on thermal switching and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge-As-Te glasses, J. Phys. D: Appl. Phys. 29 (1996) 2004-2008.

Rahman, S.; Sivarama Sastry, G., Electronic switching in Ge-Bi-Se-Te glasses, Mat. Sci, and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.;Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A.G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst, Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric field enhanced phase separation and memory switching in amorphous arsenic triselenide, Journal (??) (1972) 4609-4612.

Tichy, L.; Ticha, H., Remark on the glass-forming ability in GexSe1-x and AsxSe1-x systems, J. Non-Cryst. Solids 261 (2000) 277-281.

Titus, S.S.K.; Chatterjee, R.; Asokan, S., Electrical switching and short-range order in As-Te glasses, Phys. Rev. B 48 (1993) 14650-14652.

Tranchant,S.;Peytavin,S.;Ribes,M.;Flank,A.M.;Dexpert,H.;Lagarde,J.P., Silver chalcogenide glasses Ag-Ge-Se: Ionic conduction and exafs structural investigation, Transport-structure relations in fast Ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As-Te-Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and thermal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the the rigidity percolation threshold (<m>=2.4), J. Non-Cryst. Solids 151 (1992) 149-154.

Axon Technologies Corporation, Technology Description: *Programmable Metalization Cell(PMC)*, pp. 1-6 (Pre-May 2000).

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title p.-114 (UMI Company, May 1999).

Hirose et al., *High Speed Memory Behavior and Reliability of an Amorphous $As_2S_3$ Film Doped Ag*, Phys. Stat. Sol. (a) 61, pp. 87-90 (1980).

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Huggett et al., *Development of silver sensitized germanium selenide photoresist by reactive* sputter etching in $SF_6$, 42 Appl. Phys. Lett., No. 7 pp. 592-594 (Apr. 1983).

Kawaguchi et al., *Mechanism of photosurface deposition*, 164-166 J. Non-Cryst. Solids, pp. 1231-1234 (1993).

Kolobov and Elliott, Photodoping of Amorphous Chalcogenides by Metals, Advances in Physics, vol. 40, No. 5, 625-684 (1991).

Kozicki, et al., "Applications of Programmable Resistance Changes in Metal-doped Chalcogenides", Proceedings of the 1999 Symposium on Solid State Ionic Devices, Editors—E.D. Wachsman et al., The Electrochemical Society, Inc., 1-12 (1999).

Kozicki, et al., *Nanoscale effects in devices based on chalcogenide solid solutions*, Superlattices and Microstructures, 27, 485-488 (2000).

Kozicki, et al., *Nanoscale phase separation in Ag-Ge-Se glasses*, Microelectronic Engineering, vol. 63/1-3,155-159 (2002).

M.N. Kozicki and M. Mitkova, *Silver incorporation in thin films of selenium rich Ge-Se glasses*, Proceedings of the XIX International Congress on Glass, Society for Glass Technology, 226-227 (2001).

McHardy et al., *The dissolution of metals in amorphous chalcogenides and the effects o electron and ultraviolet radiation*, 20 J. Phys. C.: Solid State Phys., pp. 4055-4075 (1987)ƒ.

Owen et al., *Metal-Chalcogenide Photoresists for High Resolution Lithography and Sub-Micron Structures*, Nanostructure Physics and Fabrication, pp. 447-451 (M. Reed ed. 1989).

Shimizu et al., *The Photo-Erasable Memory Switching Effect of Ag Photo-Doped Chalcogenide Glasses*, 46 B. Chem Soc. Japan, No. 12, pp. 3662-3365 (1973).

G. B. Gao et al., *Negative output differential resistance in AlGaAs/GaAs heterojunction bipolar transistors*; Appl. Phys. Lett. 61(2), Jul. 13, 1992.

J. Deng, et al., *Negative Differential Conductivity in AlGaN/GaN HEMTs: Real Space Charge Transfer from 2D to 3D GaN States*? Dept of ECSE and CIEEM, Rensselaer Polytechnic Institute.

*A Negative Differential Resistance Oscillator with a Negistor*, created on Jun. 9, 2001—JLN Labs http://inaudin.free.fr/cnr/negosc/htm Nov. 22, 2002.

*Tunnel Diodes, Backward Diodes*; http://www.avtechpulse.com/faq.htm1/IV.3/ Nov. 25, 2002.

*Gunn diode*; http://w2.xrefer.com/entry.jsp?xrefid=641607 Nov. 25, 2002.

Yoji Kawamoto, et al.; "Ionic Conduction in $As_2S_3$-$Ag_2S$, $GeS_2$-GeS-$Ag_2S$ and $P_2S_5$-$Ag_2S$ Glasses" Journal on Non-Crystalline Solids 20, 393-404 (1976).

M. A. Reed et al.; "Molecular Random Access Memory Cell"; <http://ojps.aip.org/apol/aplcr.jsp>.

J. Chen, et al.; "Room-temperature Negative Differential Resistance in Nanoscale"; <http://ojps.aip.org/aplo/aplcr-jsp>.

C. Ebner et al, "Diamagnetic Susceptibility of Superconducting Clusters: Spin-glass Behavior", Physical Review B, vol. 31, No. 1, 1985.

* cited by examiner

DIFFERENTIAL NEGATIVE RESISTANCE MEMORY

FIELD OF THE INVENTION

This invention relates to devices exhibiting differential negative resistance and to methods of forming and using such devices.

BACKGROUND

Devices that exhibit differential negative resistance (DNR), also often referred to as negative differential resistance or negative differential conductance, do not function in agreement with Ohm's law. Instead, an increase in absolute voltage produces a decrease in absolute current, at least over a portion of an applied voltage range.

A DNR device that it commonly used in integrated circuits, particularly logic circuitry, is the tunnel diode (or Esaki diode). The DNR effect is displayed in tunnel diodes as a current dip in the forward I-V characteristics. For a certain range of forward voltages the current through the diode actually falls, instead of increasing, making it useful in certain switching applications, for instance.

It has recently been discovered that a chalcogenide glass structure may be configured with an excess of metal ions, e.g., Ag ions, to exhibit DNR behavior. U.S. patent application Ser. No. 10/193,529 by the inventor describes such a DNR exhibiting device suitable for use as a tunnel diode. This related application is incorporated by reference herein in its entirety. The DNR behavior of the device is characterized by a very good peak-to-valley current ratio evident in its forward I-V curve. It would be advantageous if such DNR behavior could be utilized for a memory function.

SUMMARY

The invention relates to a DNR (differential negative resistance) structure, which can be programmed to store information as an absolute DNR current maximum, thereby forming a memory element. The memory element is semi-volatile and therefore, can store data for longer periods than standard DRAM memory elements, which must be frequently refreshed. Generally, information written to a DNR memory element will retain its programmed state for minutes, hours, or days before a refresh is necessary.

The DNR structure can be produced in a variety of ways. One method of processing the structure is by blanket deposition and patterning of electrode layers, chalcogenide glass layers, and metal-chalcogenide layers. Another fabrication method is a processing-in-via method using similar layers.

Additional processing steps are performed to add silver or copper to the device to induce the DNR effect, thus enabling DNR structure to thereafter function as a DNR memory element. One way the DNR effect can be induced in the structure is by adding silver layers to the resistance variable region thereof. Annealing can be incorporated into this method as well. Another way of inducing the DNR effect is by performing an annealing step. A third way of inducing the DNR effect is by applying a negative voltage pulse to the structure at its top electrode. After the initial inducement of DNR effect, the structure can function as a memory element by exhibiting the DNR behavior in a predictable, repeatable, and stable fashion.

The DNR memory element functions by storing data as separate, maintainable maximum current states, which are programmed when voltages are applied to the memory element. As an example, a first current amplitude state may be provided when a first programming voltage potential is applied to the DNR structure. Thereafter, when a read voltage is applied, a first read current is obtained. A second read current state may be produced when a second programming voltage potential is applied to the DNR structure. Thereafter, upon application of the read voltage, a second, different read current amplitude may be read. The programmed current amplitude states are read during a read operation and are also maintained in the memory element for a relatively long time without refreshing after the programming voltages are removed (as compared to conventional DRAM). The programmed current amplitude states can be read by a sense amplifier in electrical communication with the DNR memory element. The observable DNR memory of the structure is highly stable, repeatable, and predictable, making for an excellent memory device.

In an alternative embodiment, analog memory states are possible with the DNR memory. Multiple voltage pulses can increase or decrease the amplitude of the readable current amplitude states. In this way the ultimate current read at the DNR device can be finely tuned throughout an analog range.

These and other advantages and features of the present invention will be more apparent from the following detailed description and drawings which illustrate various embodiments of the invention.

DETAILED DESCRIPTION

In the following detailed description, reference is made to the accompanying drawings, which are a part of the specification, and in which is shown by way of illustration various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention. Additionally, certain processing steps are described and a particular order of processing steps is disclosed; however, the sequence of steps is not limited to that set forth herein and may be changed as is known in the art, with the exception of steps or acts necessarily occurring in a certain order.

The terms "wafer" and "substrate" are to be understood as interchangeable and as including any foundation suitable for supporting a DNR memory element of the invention. Preferably, the substrate is silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "wafer" or "semiconductor substrate" in the following description, previous process steps may have been utilized to form regions, junctions or material layers in or on the base semiconductor structure or foundation. In addition, the semiconductor substrate need not be silicon-based, but could be based on silicon-germanium, germanium, gallium arsenide, or other known semiconductor materials. Further, the substrate need not be semiconductor-based at all, but can be any material suitable for supporting an integrated circuit, for instance, polymer, glass, metals, insulated metals, ceramics, and other materials.

Figure 1:
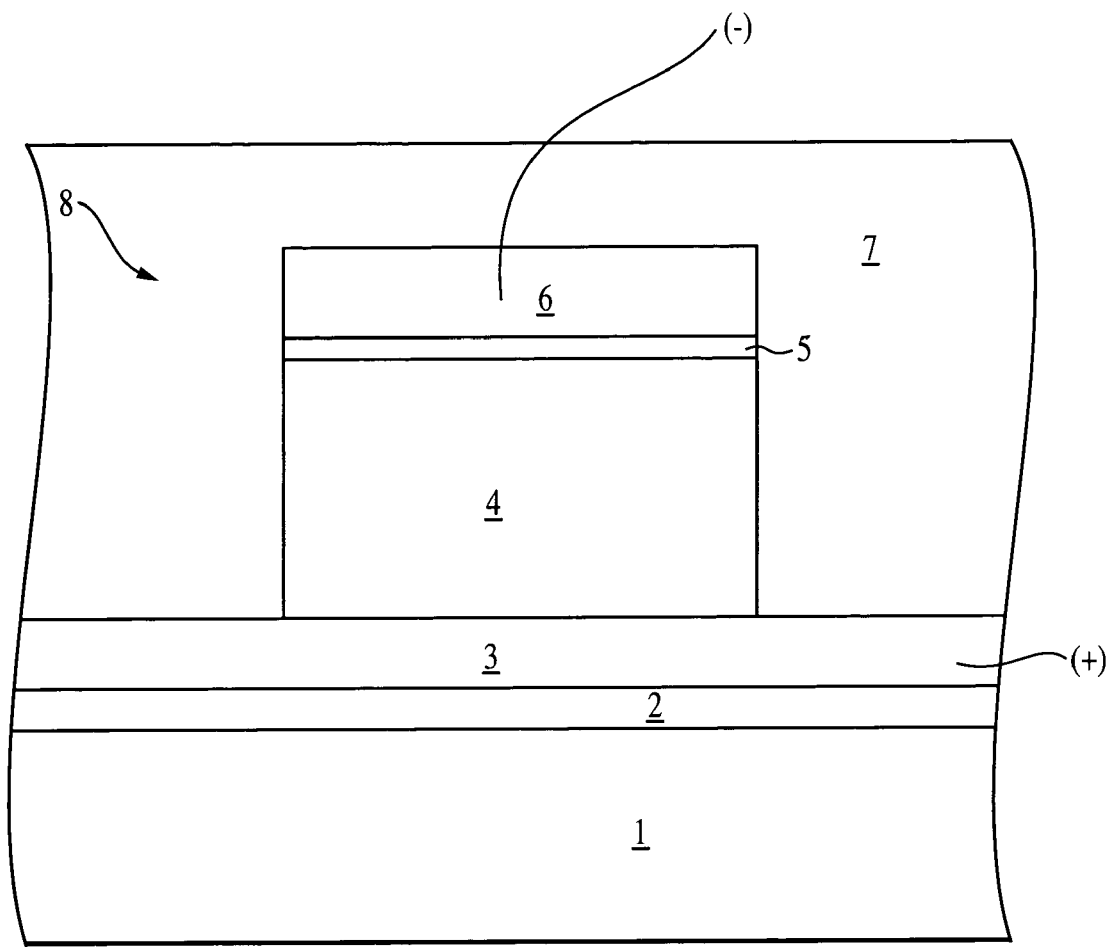
FIG. 1 shows a DNR memory device in accordance with the invention.

Now referring to the figures, where like reference numbers designate like elements, substantially complete DNR memory devices 8, 100, 100', and 100" incorporating DNR memory elements in accordance with various embodiments of the invention are respectively shown in FIGS. 1, 9, 17, and 18. These shown structures 8, 100, 100', and 100", while not limiting, are illustrative of the invention. A basic structure of the device of a first exemplary embodiment of the invention is shown in FIG. 1. It is an exemplary DNR-exhibiting memory element 8 that can be programmed to store information as stable current states at read voltage(s) in response to applied programming voltages. A first programming voltage can increase the current at a read voltage. A second programming voltage can decrease the current at a read voltage. The stored data (readable absolute current amplitude) is semi-volatile, meaning that it retains a stored data state for relatively long periods of time, e.g., minutes, hours, or even days. The stored data is not necessarily completely non-volatile and may require some refreshing.

FIG. 1 shows the DNR memory device 8 supported by a substrate 1. Over the substrate is an optional insulating layer 2, which can be $Si_3N_4$, for example. An electrode (serving typically as the anode) is provided over the substrate 1 as layer 3. Over layer 3 a resistance variable region is formed of a chalcogenide-based glass layer 4 and an optional metal layer 5. The chalcogenide-based glass layer 4 is preferably $Ge_xSe_{1-x}$, where x is about 18–40, with 20, 25, and 40 being preferred. The chalcogenide-based glass layer 4 should also incorporate a metal, preferably silver or copper, with silver typically being preferred over copper. The metal can be incorporated into the chalcogenide-based glass layer 4 by doping or co-evaporation, for example. The chalcogenide-based glass layer 4 can be doped with metal by photo- or thermal diffusion. The metal layer 5 can comprise silver or copper, depending on with which metal the chalcogenide-based glass layer 4 is to be doped. It is the resistance variable region that stores data as multiple readable current amplitudes programmed in response to applied voltages. The voltages are applied by a second electrode, which can be layer 6. This electrode can be silver or copper, if desired. As stated above, layer 5 is optional and if not utilized, layer 6 should include the metal with which the chalcogenide-based glass layer 4 is to be doped; silver or copper as appropriate. The device 8 may be electrically isolated by an insulating layer 7.

The FIG. 1 device 8 may be constructed by successive blanket depositions of the various layers of the device 8 over a substrate, which are subsequently etched to form individual devices in a manner similar to that described with respect to the embodiment shown in FIGS. 2–9. Alternatively, a via can be formed in an insulating layer and device 8 can be formed by deposition of the various layers within the via in a manner similar to that described below with respect to the embodiments shown in FIGS. 10–17.

Throughout the detailed description reference is made to applied voltages used to achieve the current amplitude memory states. These described current amplitudes and voltages can be positive or negative and the devices described herein can function in equivalent ways based on either positive or negative applied voltages. The exemplary voltages are applied at the upper electrode of the DNR devices.

The memory element of the invention stores data based on its ability to change to and maintain discrete observable (when a read voltage is applied) current amplitude states by utilizing DNR behavior over a predictable range of applied DC voltage potentials. The memory element typically is connected to electrodes (see layers 3 and 6 in FIG. 1) on either side of a resistance variable region, which typically includes a chalcogenide-based glass. The top electrode is generally the cathode and provides a negative potential to the memory element.

Figure 1A:
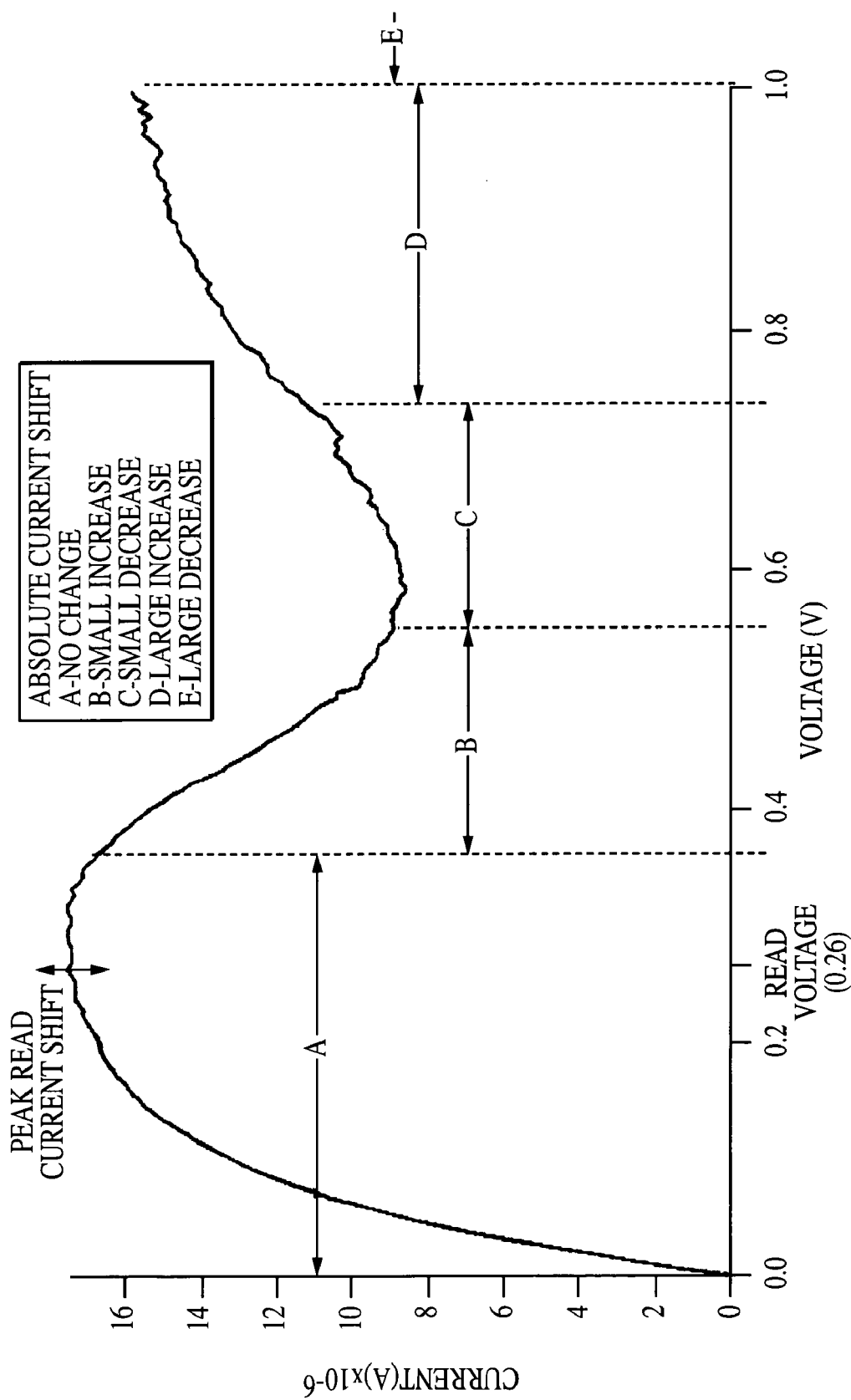
FIG. 1a is a graph illustrating typical DNR memory behavior exhibited by devices in accordance with the invention.

Typical DNR behavior of the memory element of the device is illustrated generally by the graph of FIG. 1a. The graph of FIG. 1a shows an I-V (current-voltage) curve for an embodiment of the invention upon application of voltage potentials up to about 1.0 V. The memory is read by applying a voltage in region A of the graph, preferably a voltage corresponding to the peak absolute current produced in this region by a non-programmed device, which is shown in the graph to be about 0.26 V. By applying voltages in regions B–E, which are programming regions, the peak absolute current at the read voltage can be shifted to increase or decrease. After programming with a voltage in the regions B–E, the shifted current is maintained in a semi-volatile memory. Two extreme current-shifting voltages, one increasing and one decreasing the peak absolute readable current, can be used to write a first and a second memory state for semi-volatile digital memory, each of which can be read at about 0.26 V.

FIG. 1a shows the five exemplary applied voltage ranges A, B, C, D, and E, which can influence the ultimate readable current in the DNR memory. Voltages within region A should be considered read voltages. No matter how the device is written by voltages in regions B–E, it is always read at the same read voltage, e.g., 0.26 V in FIG. 1a, which is related to the peak absolute current amplitude of the device in region A. DNR behavioral response is best exhibited in the regions B–E. An applied voltage within region B, defining a range of about 0.36 V to about 0.55 V, will result in a relatively small increase in readable current in the programmed device when read at the read voltage, e.g., 0.26 V. An applied voltage within region C, defining a range of about 0.55 V to about 0.74 V, will result in a relatively small decrease in programmed readable current. An applied voltage within region D, defining a range of about 0.74 V to about 1.0 V, results in a relatively larger increase in programmed readable current at the read voltage. An applied voltage in region E, which extends beyond 1.0 V, results in a relatively larger decrease in programmed readable current. Thus, by using programming voltages in the range of D and E, one can cause significant shifts, upward for region D and downward for region E, in the current read at the read voltage, e.g., 0.26 V.

The memory element can be written-to very quickly, thereby meeting or exceeding the programming timing requirements of standard memory circuitry used in the art. Programming to either the first or second readable current states can be performed in about 8 ns or less, easily fast enough for present memory applications.

Although the memory states of the DNR memory are generally discussed herein as digital memory, it is also possible to use the device as an analog memory as well. To program the device as analog memory, a plurality of write voltages selected from regions B–E can be used to change the current read by the read voltage to a plurality of respective different values. Voltages from each region shift the readable current to a designated degree and current shifts from multiple voltages can be compounded so that multiple current levels can be written to and read from the DNR element by the read voltage. The analog memory is, like the digital memory, semi-volatile.

Returning again to discussion of digital memory, where two different current states are used for storage, the semi-volatile data retention for the memory element in the higher and lower current amplitude states can be stable for minutes, hours, and even days without refreshing. A regular refresh may be needed for long-term memory storage. The refresh can be provided by the application of a stabilizing voltage potential of about the same magnitude as that required to program the memory element to its set current state. Thus, for example, to refresh data written by an applied voltage in region B, the same voltage in region B can be applied. Likewise, to refresh data written by a voltage in region C, the same voltage in region C can be applied. The refresh voltage application does not disturb the written state of the memory element, but stabilizes the memory element to maintain the stored data.

The data stored in the DNR-exhibiting memory element can be read by a sensing device in electrical communication with the memory element upon application of a designated read voltage, which is typically a voltage in region A of the graph in FIG. 1a. As noted, for the exemplary device depicted in FIG. 1a, the exemplary read voltage is at about 0.26 V. The designated read voltage corresponds to a peak absolute current amplitude exhibited by a non-programmed device corresponding to a voltage in region A. The sensing device (e.g., sense amplifier 304 shown in FIGS. 19, 20, and 21) in communication with the memory element (e.g., structure 8 or 100) can be set up to read relative high or low current amplitude through the memory element, which relates to the first memory state and second memory state. Suitable sensing devices for sensing the multiple current levels of the analog DNR memory can also be provided.

As an example of use of the DNR device as a memory element, a "1" can be represented by an increased current level obtained by programming the device using a voltage in region B (for small current increase) or in region D (for larger current increase). The programmed "1" value would be read by application of a voltage of about 0.26 V, which produces the increased read current relative to the observable current of a non-programmed device at the read voltage. For instance, if the non-programmed current corresponding to the designated read voltage is x µA, the programmed "1" would be read as (x+y) µA, where y is the current amplitude increase resulting from programming. The "0" state may be represented by the non-programmed current level of x µA, or alternatively can be represented by a lowered current obtained by programming the device with a voltage in the range of C or E. In this instance, the "0" value would be read by application of about 0.26 V, which would produce a read current of about (x−z) µA, where z is the decrease in current amplitude resulting from programming. Note that the above described correlation between writing voltages and data written, i.e., a "1" or a "0," is arbitrary and can just as easily be reversed.

It is also possible to reset (as opposed to refresh) the memory device (e.g., device 8 or 100) to a completely non-programmed state. By applying about a 2.0 V or greater potential to the device, it can be reset to have no stored information so that it can be freshly written-to by application of a programming voltage, which sets the memory element to a particular memory state.

The programming of the DNR memory has been discussed above as utilizing DC voltages, however, it is also possible to use AC voltage programming. The voltage potential requirements to obtain the maximum current increase or decrease to the programmed memory states varies depending on AC pulse width. For pulses greater than 500 ns, the voltage potential amplitude requirements are similar for voltage requirements when using DC voltage programming.

Figure 2:
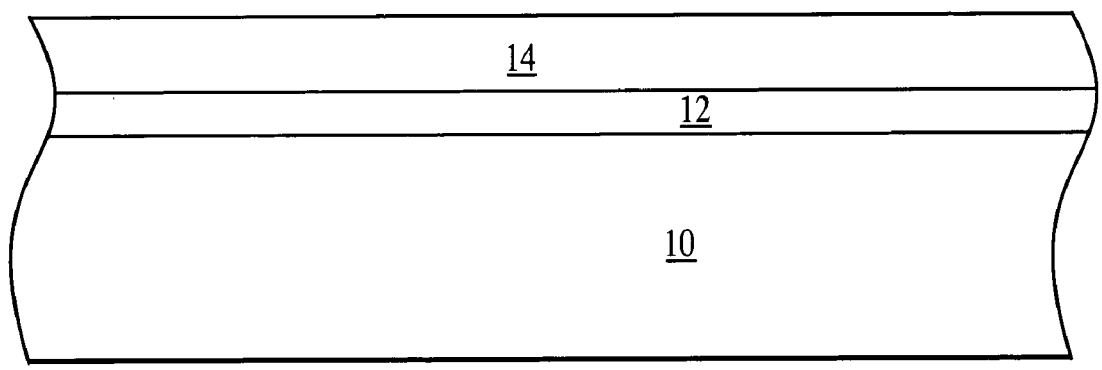
FIGS. 2 through 9 show a partial cross-section of a wafer during processing in accordance with an embodiment of the invention, with FIG. 9 showing a substantially complete device in accordance with that embodiment.

FIGS. 2 through 9 illustrate another exemplary embodiment of a DNR memory device 100 in accordance with the invention at various stages of processing. FIG. 2 shows a section of a substrate 10 for supporting a plurality of memory devices 100 in accordance with the invention. Although only a single device 100 cross-section is shown at various stages of processing for the sake of clarity of description, it is intended that a plurality of such devices 100 be fabricated simultaneously in an array of M×N memory cells. It is further intended that such arrays of memory cells can be stacked, one above another, to increase the density and total memory capacity of the integrated circuit.

The substrate 10 in FIG. 2 can be any suitable material for supporting an integrated circuit, for example, monocrystalline silicon, or a polymer material. Over the substrate 10 is a layer of insulating material 12. This layer 12 is optional and can be silicon dioxide, silicon nitride, boropohosphosilicate glass (BPSG) or other insulative materials; it can be deposited as is known in the art. Over the substrate 10 or optional insulating layer 12 is formed a conductive layer 14, which will later serve as the bottom electrode (e.g., anode) of the device 100. This conductive layer 14 can be any material suitable for an integrated circuit interconnect since it can also serve as a column line or row line and a common bottom electrode for multiple memory devices 100 of the array. The conductive layer 14 can be, e.g., doped polysilicon, or a metal such as silver, tungsten, titanium, nickel, platinum, tantalum, other metals, alloys or combinations of these and other metals, or metal nitrides. This conductive layer 14 can be blanket deposited as is known in the art.

Figure 3:
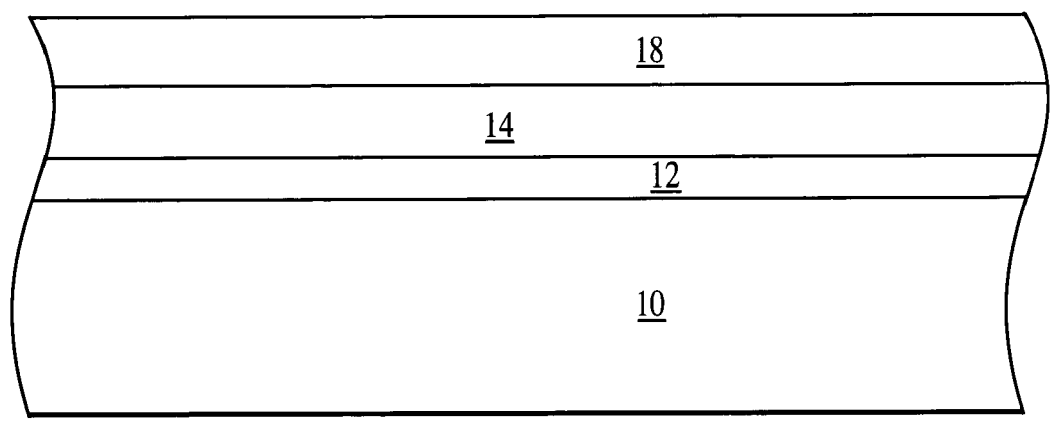

FIG. 3 shows a stage of processing subsequent to that shown in FIG. 2. Over the conductive layer 14 is formed a chalcogenide-based glass layer 18. This layer 18 is preferably a germanium selenide glass composition of formula $Ge_xSe_{100-x}$, where x is preferably in the range of about 18 to about 43, and more preferably is about 20, 25, or 40. This glass layer 18 can be about 100 Å to about 300 Å in thickness, preferably about 150 Å. The glass layer 18 can be formed by any suitable method. Preferred methods of deposition are evaporation, co-sputtering the components, sputtering from a proportional source, or chemical vapor deposition (CVD). The glass layer 18 can serve as a glass backbone for the device. The glass layer 18 also incorporates a metal, such as silver, for example. Silver can be incorporated in to the glass layer 18 by co-sputtering or doping (e.g., photo- or thermal diffusion), for example.

Optionally, a thin layer of metal 19, such as silver, can be deposited over the glass layer 18 prior to the forming of a metal-chalcogenide layer 20 thereover. By adding this thin metal layer 19 it can be ensured that the glass layer 18 incorporates enough metal to enable the DNR functioning of the ultimate device.

Figure 4:
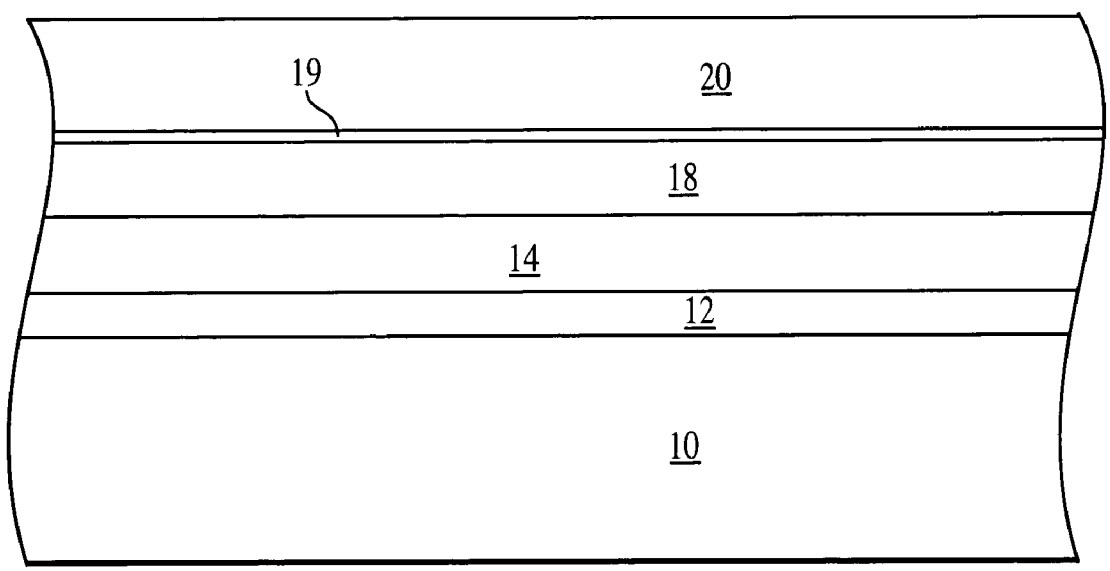

FIG. 4 shows a stage of processing subsequent to that shown in FIG. 3. Over the glass layer 18 (or thin metal layer 19 if used) is formed a metal-chalcogenide layer 20. If optionally used, is it preferred that the thin metal layer 19 be the same metal as that of the metal-chalcogenide layer 20. The metal of the metal-chalcogenide layer 20 is preferably silver (as is the thin metal layer 19). As an alternative, the metal of the metal-chalcogenide layer 20 can be copper. The other component of the metal-chalcogenide layer 20 is a chalcogenide material, preferably selenium. Combined, the two preferred components form silver selenide ($Ag_2Se$) as layer 20. Additional silver can be incorporated into the $Ag_2Se$ ($Ag_{2+x}Se$) layer as elemental silver, silver ions, or silver compounds or alloys. This preferred combination of components should contain enough silver to donate silver to an adjacent chalcogenide glass layer (e.g., layer 18) during the operation of the memory device 100. The metal-chalcogenide layer 20 can be formed by evaporative deposition, sputtering, co-sputtering, or other known methods. The metal-chalcogenide layer 20 can be about 200 Å to about 1,000 Å thick. It is preferably thicker than the underlying glass layer 18 in a ratio of thickness of about 1:1 to about 5:1 compared to the glass layer 18. More preferably, the ratio is between 2:1 and 3.1:1.

Figure 5:
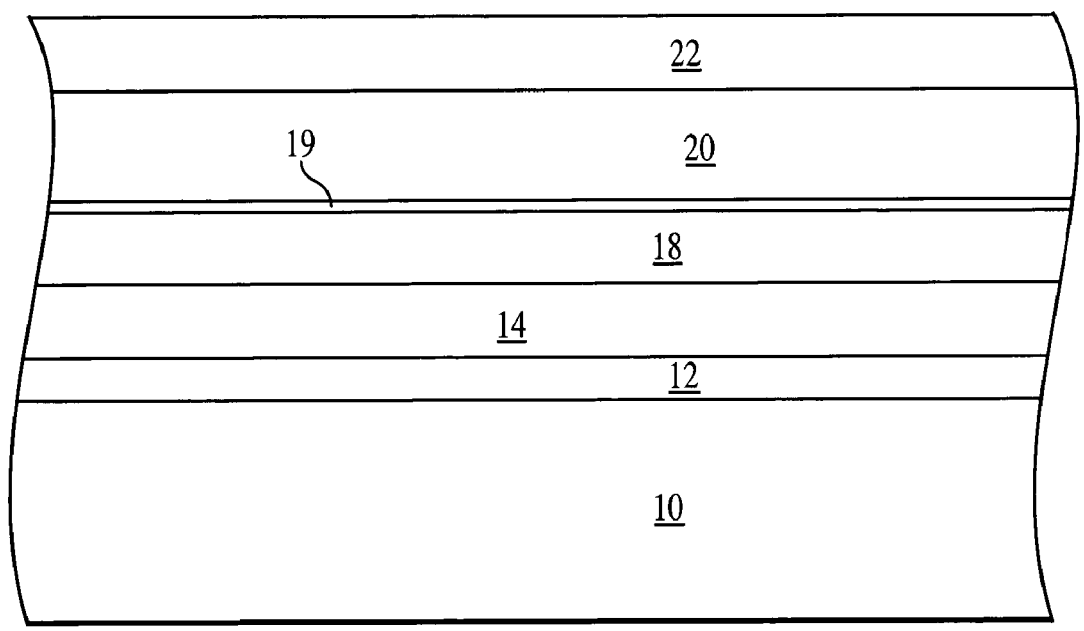

FIG. 5 shows a stage of processing subsequent to that shown in FIG. 4. A second chalcogenide-based glass layer 22 is formed over the metal-chalcogenide layer 20. The forming of the second glass layer 22 completes a resistance variable region with layers 18 and 20. The second glass layer 22 can be made of the same materials (e.g., $Ge_xSe_{100-x}$) as the first glass layer 18. Additionally, the second glass layer 22 can also have the same stoichiometry as the first glass layer 18. The second glass layer 22 preferably is about 50 Å to about 500 Å thick, and more preferably about 150 Å thick. Again, like the first glass layer 18, the second glass layer 22 can be deposited by evaporation, sputtering, co-sputtering, CVD, or other known techniques.

Figure 6:
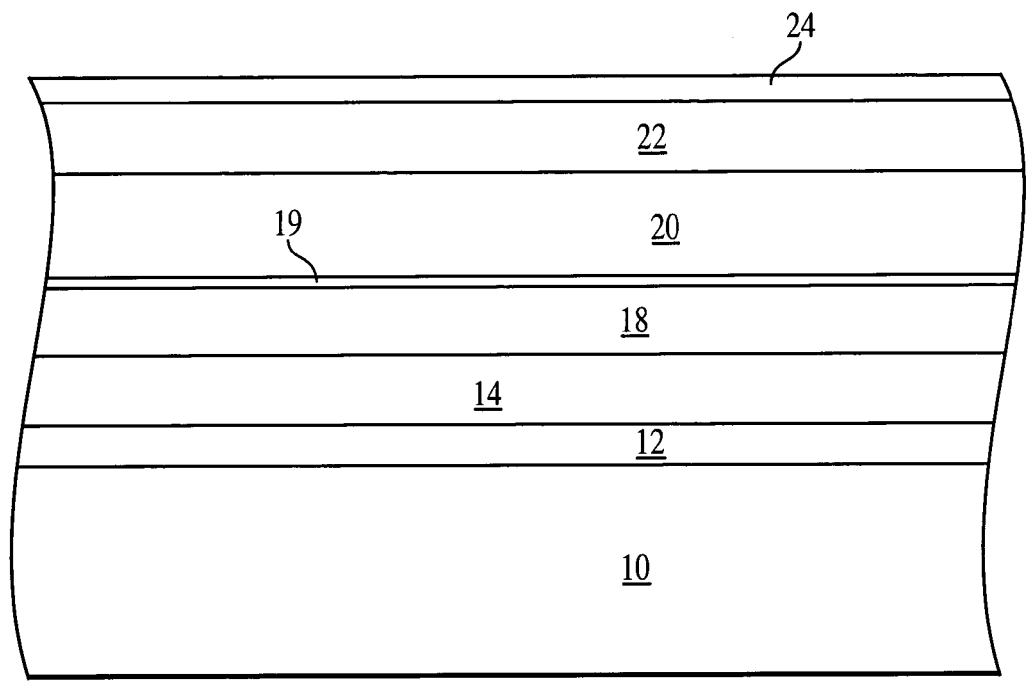

FIG. 6 shows the formation of an optional metal layer 24 over the second glass layer 22. If the thin metal layer 19 optionally formed over layer 18 is not used, then this optional metal layer 24 should be incorporated into the device. Preferably, this optional metal layer 24 is the same metal as that of the metal-chalcogenide layer 20, e.g., preferably silver or copper. Silver is preferred over copper for most applications. Typically, the metal layer 24 is thin, e.g., 500 Å or less, with less than 200 Å being preferred.

Figure 7:
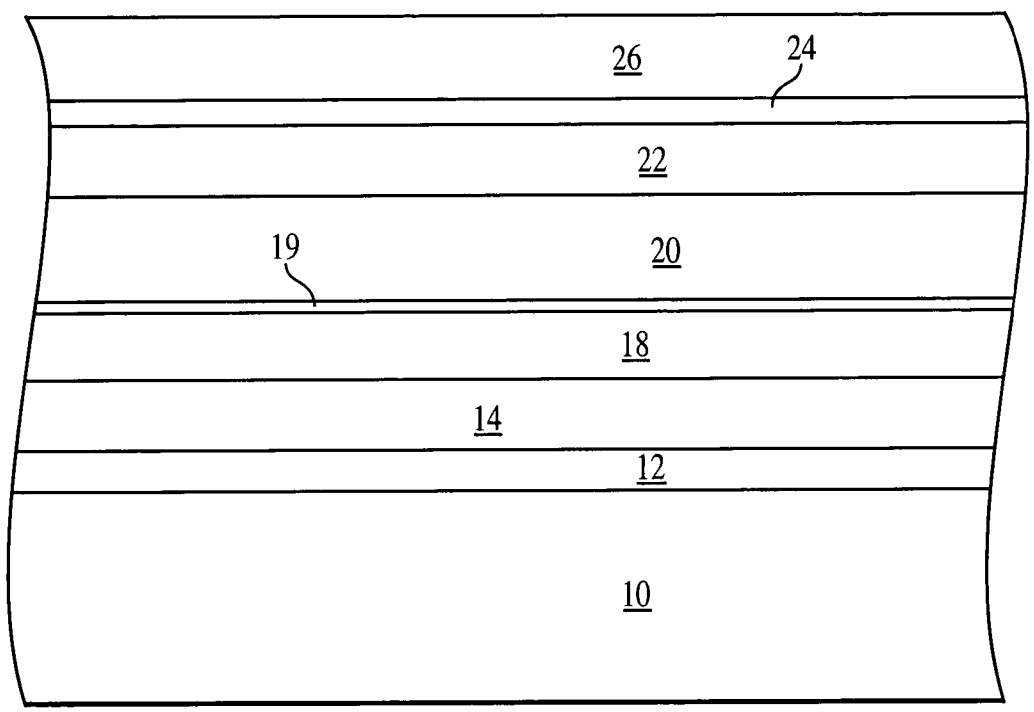

FIG. 7 shows a stage of processing subsequent to that shown by FIG. 6 (or FIG. 5 if the optional metal layer 24 is not desired). A second conductive layer 26 is formed over the metal layer 24 (or second glass layer 22 if layer 24 is omitted). The second conductive layer 26 is a top electrode (e.g., cathode) of the device 100 and can be made of the same materials as the lower electrode conductive layer 14. Alternatively, and particularly if the optional metal layer 24 or the optional metal layer 19 over layer 18 are not utilized, the second conductive layer 26 should be silver; the first conductive layer 14 can then be another metal, such as platinum, tantalum, tungsten, titanium, aluminum, or copper.

Figure 8:
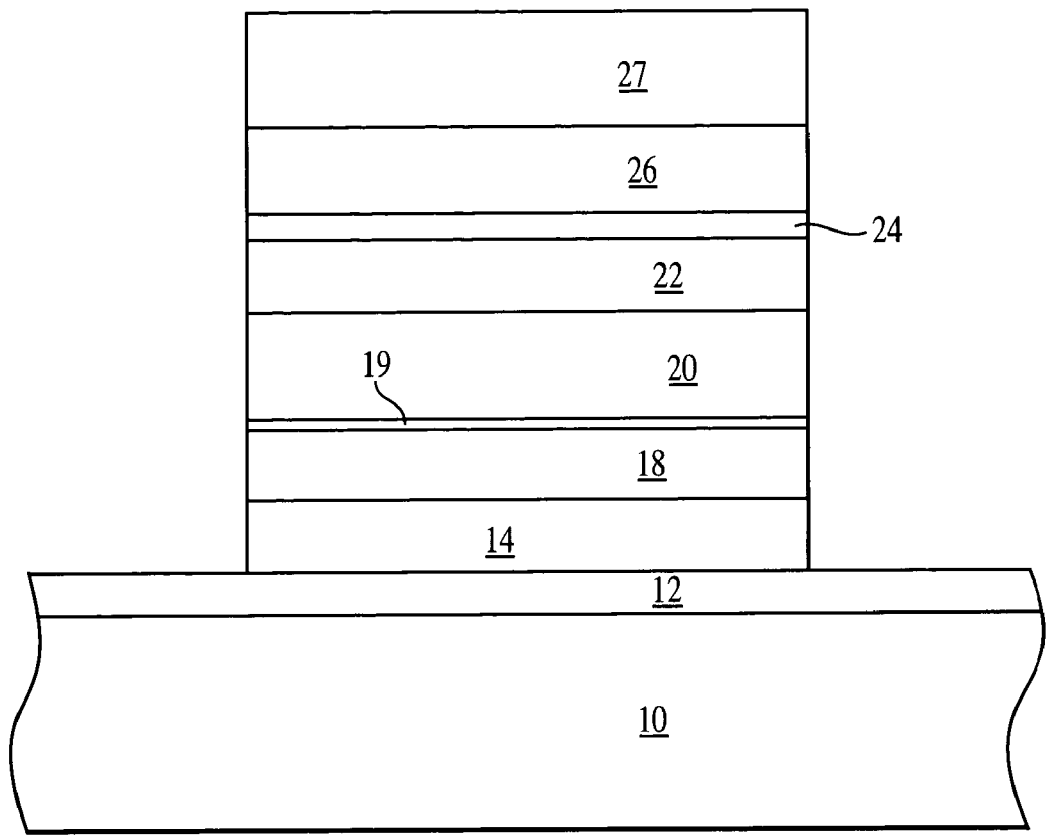

As shown by FIG. 8, after forming the various layers 14, 18, 19, 20, 22, 24, 26 of the device 100, the wafer is patterned with a photoresist mask 27 and etched using insulating layer 12 as an etch stop layer to leave stacks. Alternatively, the lower electrode conductive layer 14 can be the etch-stop. The stacks will define the substantially complete memory devices 100. After removing the photoresist 27, an insulating layer 16 is deposited over the stacks to electrically isolate them from one another and other devices. The insulating layer 16 can be any of those known in the art, such as oxide, silicon oxide, silicon nitride, or other dielectric materials, but is preferably parylene. Using parylene for layer 16 allows its deposition to be low temperature. If layer 16 is parylene, it is deposited by vapor phase deposition. Once electrically isolated, the DNR memory device 100 is substantially complete. Electrical connections can be made between the DNR memory device and other devices of the integrated circuit.

Figure 10:
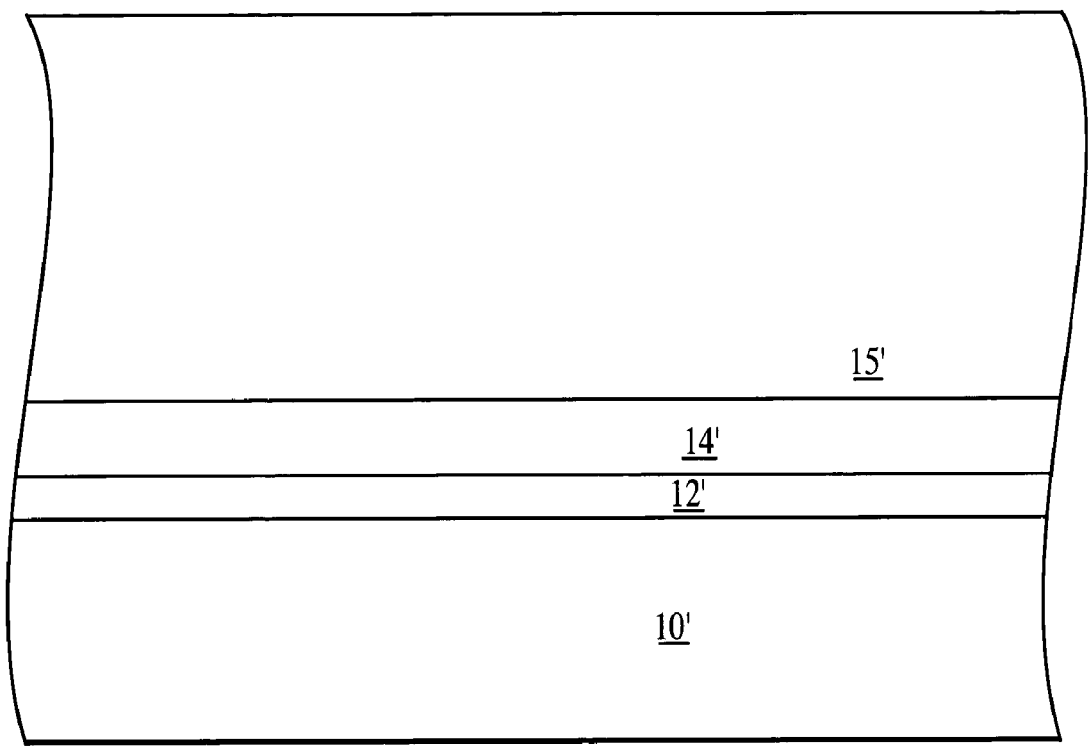
FIGS. 10 through 17 show a partial cross-section of a wafer during processing in accordance with another embodiment of the invention, with FIG. 17 showing a substantially complete device in accordance with that embodiment.

Another embodiment of the invention utilizing an alternative processing method is illustrated by FIGS. 10–17. The alternative embodiment utilizes processing-in-via methodology. As shown in FIG. 10, the processing can begin with the same material layers as the preceding embodiment. A substrate 10' is provided. Over the substrate can be the optional insulating layer 12'. Over the substrate 10' or optional insulating layer 12' (if utilized) is a conductive layer 14', which will serve as a bottom electrode (e.g., anode) for the memory device 100'. A thick dielectric layer 15 is provided over the conductive layer 12'. The dielectric layer 15 should be of a material appropriate for the formation of a via therein. Each of these layers can comprise the same materials and be formed like the respective layers discussed above in the former embodiment, with the exception of the dielectric layer 15, which must be appropriate for etching a via.

Figure 11:
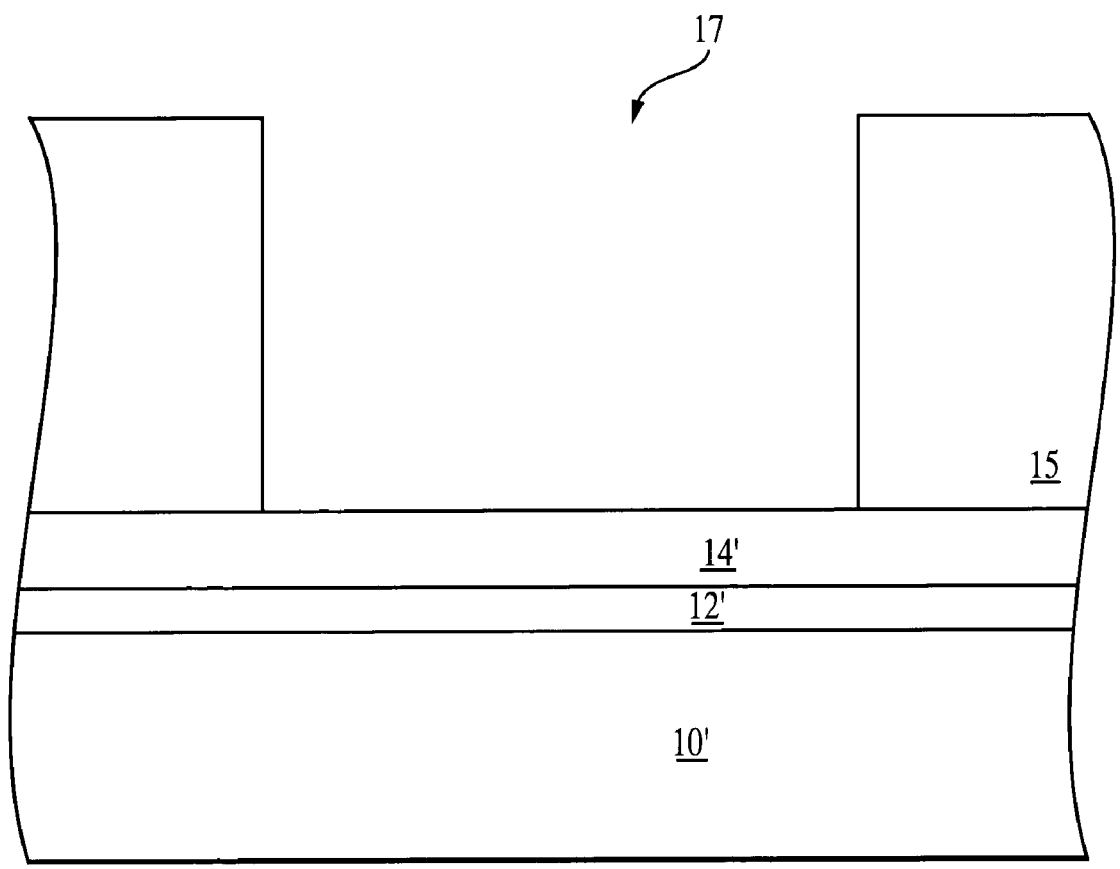
Figure 12:
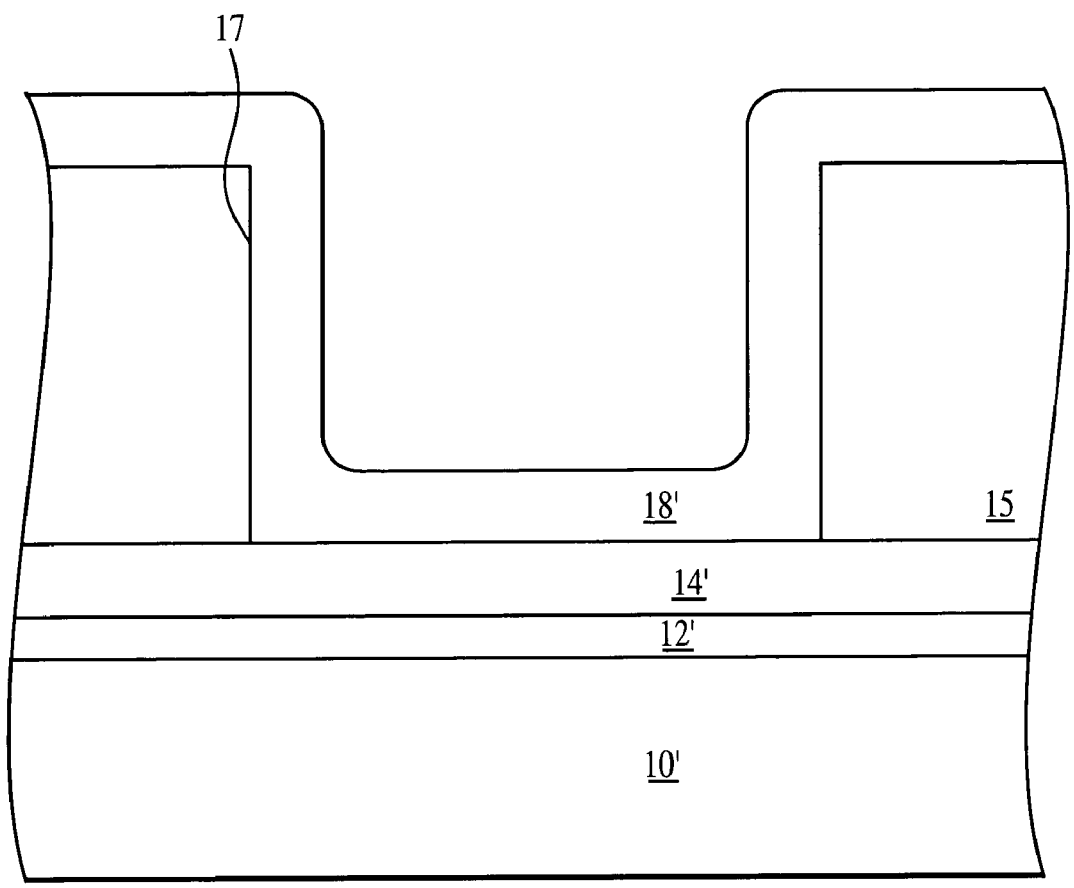

As shown in FIG. 11, the dielectric layer 15 is patterned and etched by standard known methods (e.g., photolighography and etching) to form a via 17 down to and exposing a portion of the conductive layer 14'. Now referring to FIG. 12, a chalcogenide-based glass layer 18' is formed over the conductive layer 14' and within the via 17. Typically, the glass layer 18' is conformally deposited. The glass layer 18' can be optionally etched-back to leave the glass layer 18' remaining only within a lower portion of the via 17. Again, this glass layer 18' is preferably germanium selenide ($Ge_xSe_{100-x}$) of the same stoichiometry and thickness as described above in relation to the respective layer 18 of the above-discussed embodiment. Additionally, the glass layer 18' will also incorporate a metal as does respective layer 18.

Figure 13:
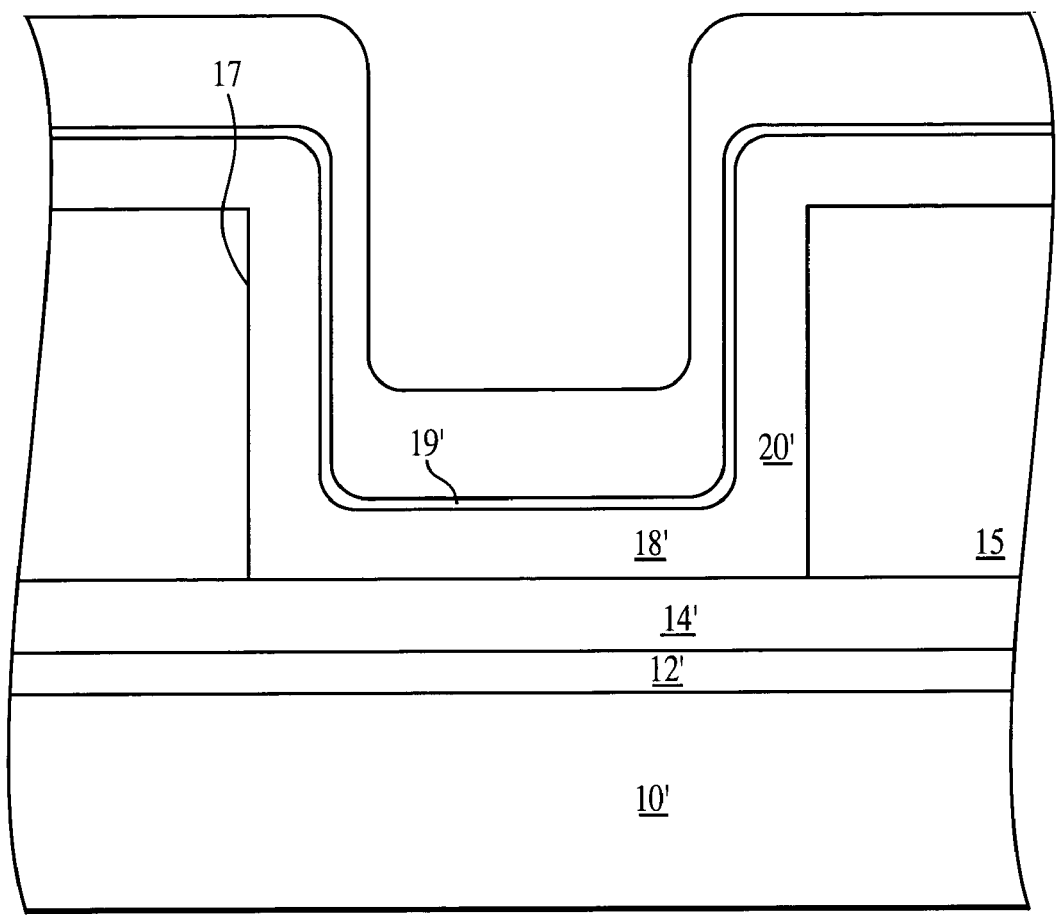

As shown in FIG. 13, a metal-chalcogenide layer 20' is formed over the glass layer 18' and within the via 17. This metal-chalcogenide layer 20', too, is typically conformally deposited, but may be etched-back to leave the material only within a lower portion of the via 17. As with the first embodiment, an optional thin layer of metal 19', such as silver, can be (conformally) deposited over the glass layer 18' prior to the forming of the metal-chalcogenide layer 20'. Also, the metal of the metal-chalcogenide layer 20' is preferably silver (as is the thin metal layer 19' if used). As an alternative, the metal of the metal-chalcogenide layer 20' can be copper. The other component of the metal-chalcogenide layer 20' is a chalcogenide material, again, preferably selenium for an $Ag_2Se$ composition. However, the chalcogenide component can be another chalcogenide material as well. The metal-chalcogenide layer 20' should be deposited like, and have a similar thickness to, the respective layer 20 described in the previous embodiment.

Figure 14:
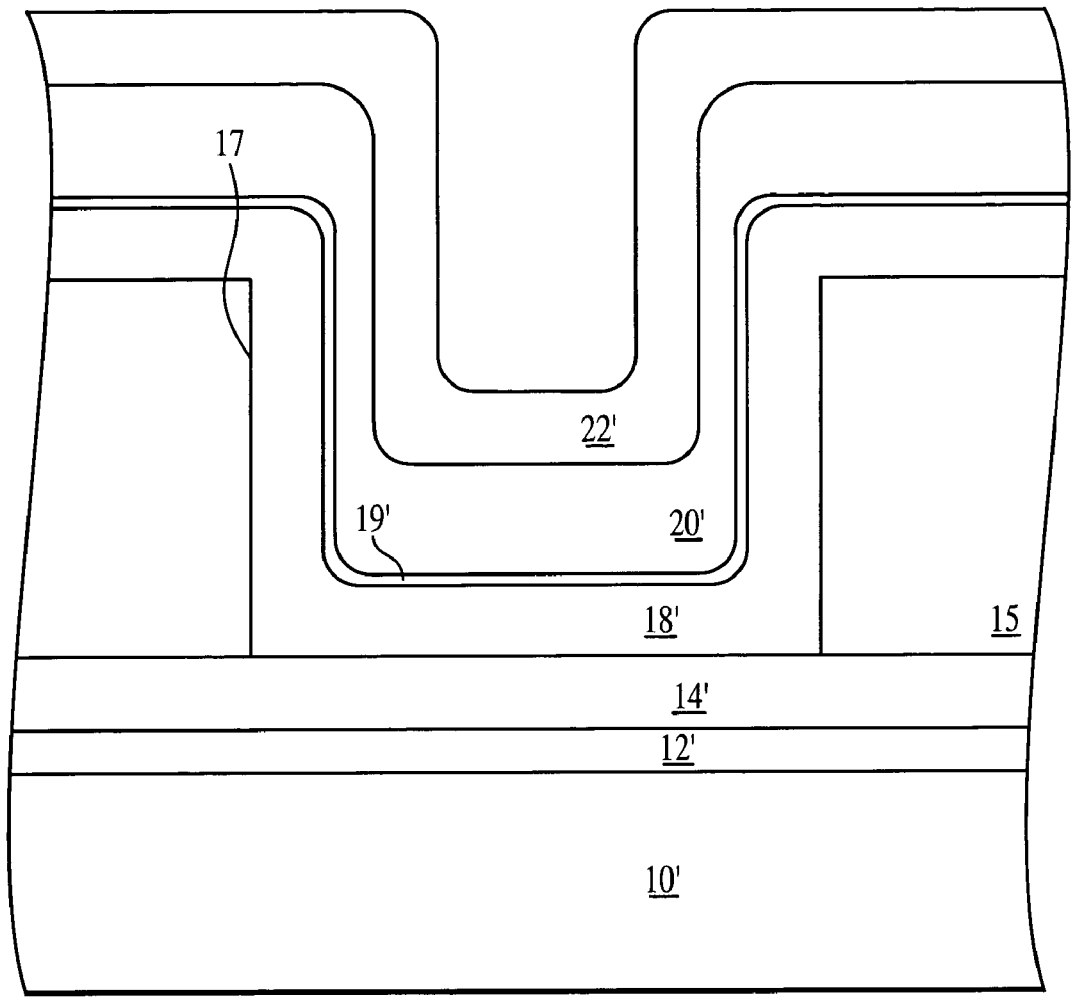

Now referring to FIG. 14, a second chalcogenide-based glass layer 22' is formed over the metal-chalcogenide layer 20' and within the via 17. The second glass layer 22' is formed of the same materials, in the same preferred thickness range, and by the same methods as discussed for the same layer 22 in the first embodiment. Again, like the other layers 18', 20' within the via 17, the second glass layer 22' is conformally deposited, but can likewise be etched-back if desired. Upon forming the second glass layer 22' (with layers 18' and 20') the resistance variable region of the device 100' is substantially complete.

Figure 15:
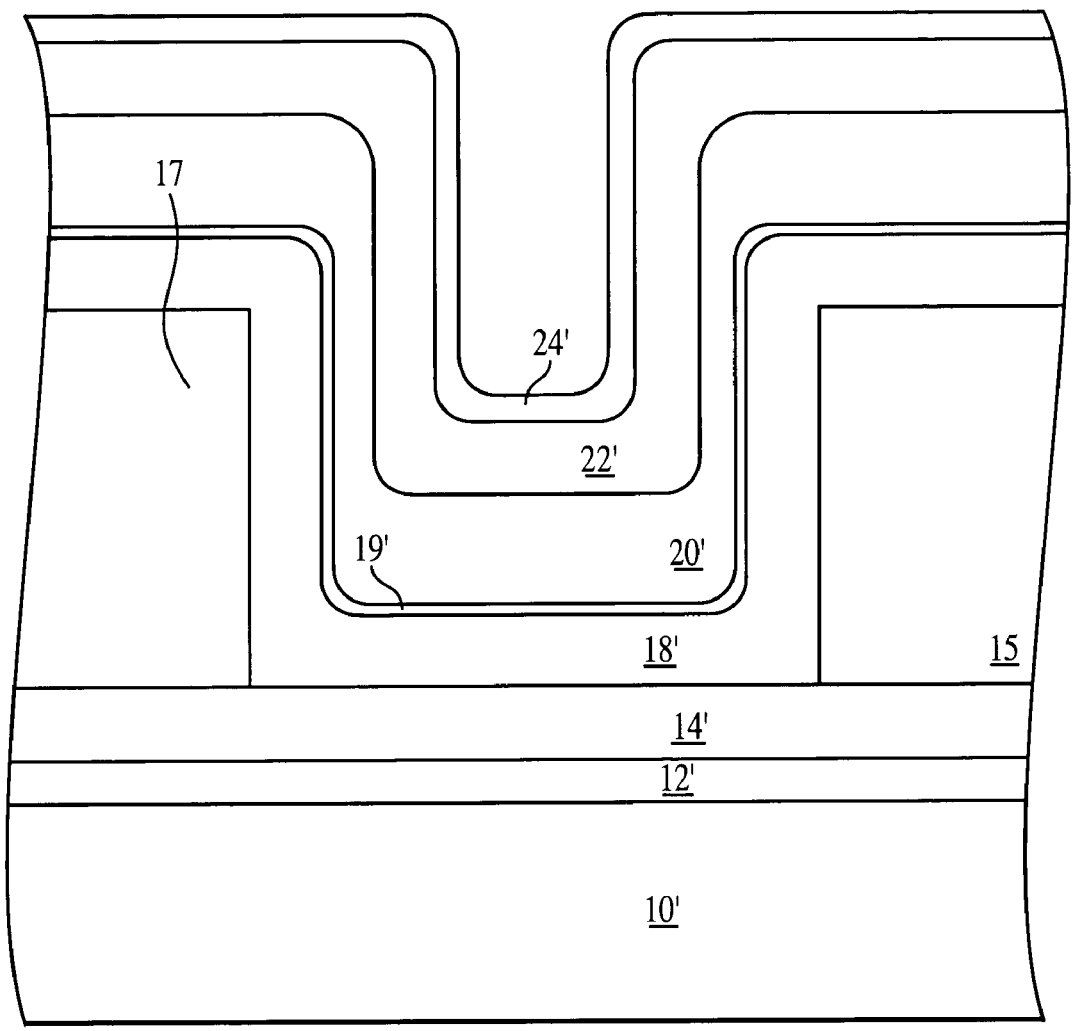

FIG. 15 shows an optional thin metal layer 24' formed over the second glass layer 22' and within the via 17. As with the previously described embodiment, the optional metal layer 24' is preferably the same metal as that of the metal-chalcogenide layer 20', e.g., preferably silver or copper. Again, the optional metal layer 24' is about 300 Å or less, with less than 50 Å being preferred. As with the other layers 18', 20', 22', the optional metal layer 24' may be conformally deposited and then etched back if desired.

Figure 16:
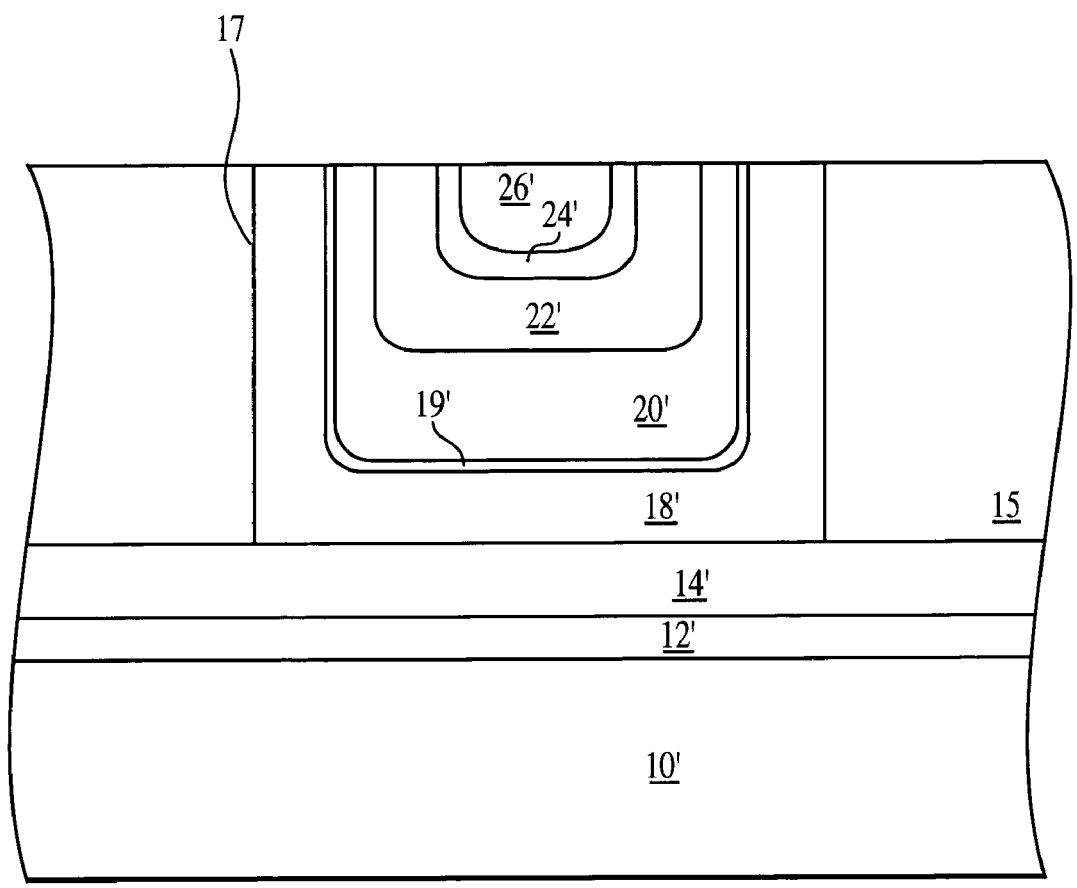
Figure 17:
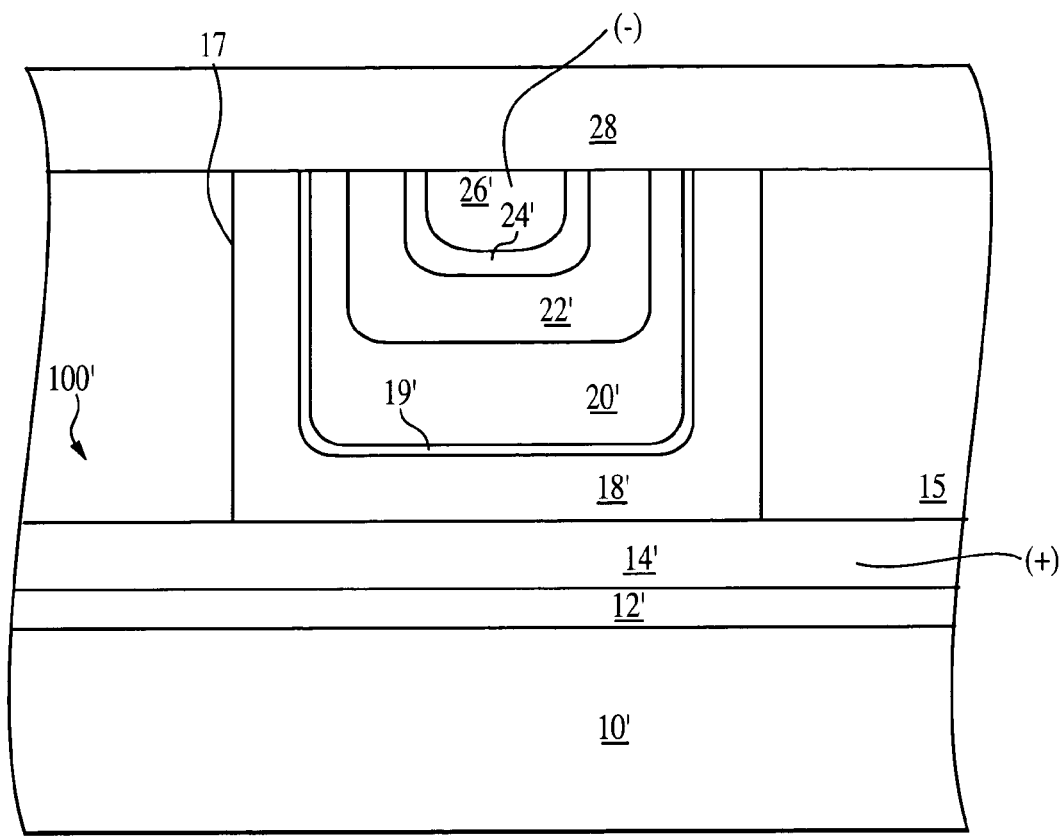

Now referring to FIG. 16, a second conductive layer 26' is formed over the second glass layer 22' (or optional metal layer 24' if present). The second conductive layer 26' is a top electrode (e.g., cathode) of the memory device 100'. The second conductive layer 26' can be formed similarly to the respective layer 26 of the previous embodiment and of like materials. Typically, layer 26' is conformally deposited. After forming the second conductive layer 26', the wafer can be patterned and etched so that the layers 18', 19', 20', 22', 24', and 26' are removed down to the level of the dielectric layer 15 beside the via 17, as shown in FIG. 17. As shown in FIG. 17, an insulating layer 28 is formed over the wafer, covering the first dielectric layer 15 and the second conductive layer 26'. Insulating layer 28 can be parylene, similarly to layer 16 in the previous embodiment. This layer 28 can be planarized by RIE or CMP methods, if desired.

At this point in processing the device 100' is substantially structurally complete. Remaining processing can include forming electrical connections to peripheral devices, such as sense amplifiers or logic circuitry. Also, additional arrays having memory cells like the just-described device 100' can be formed over the dielectric layer 28.

Figure 18:
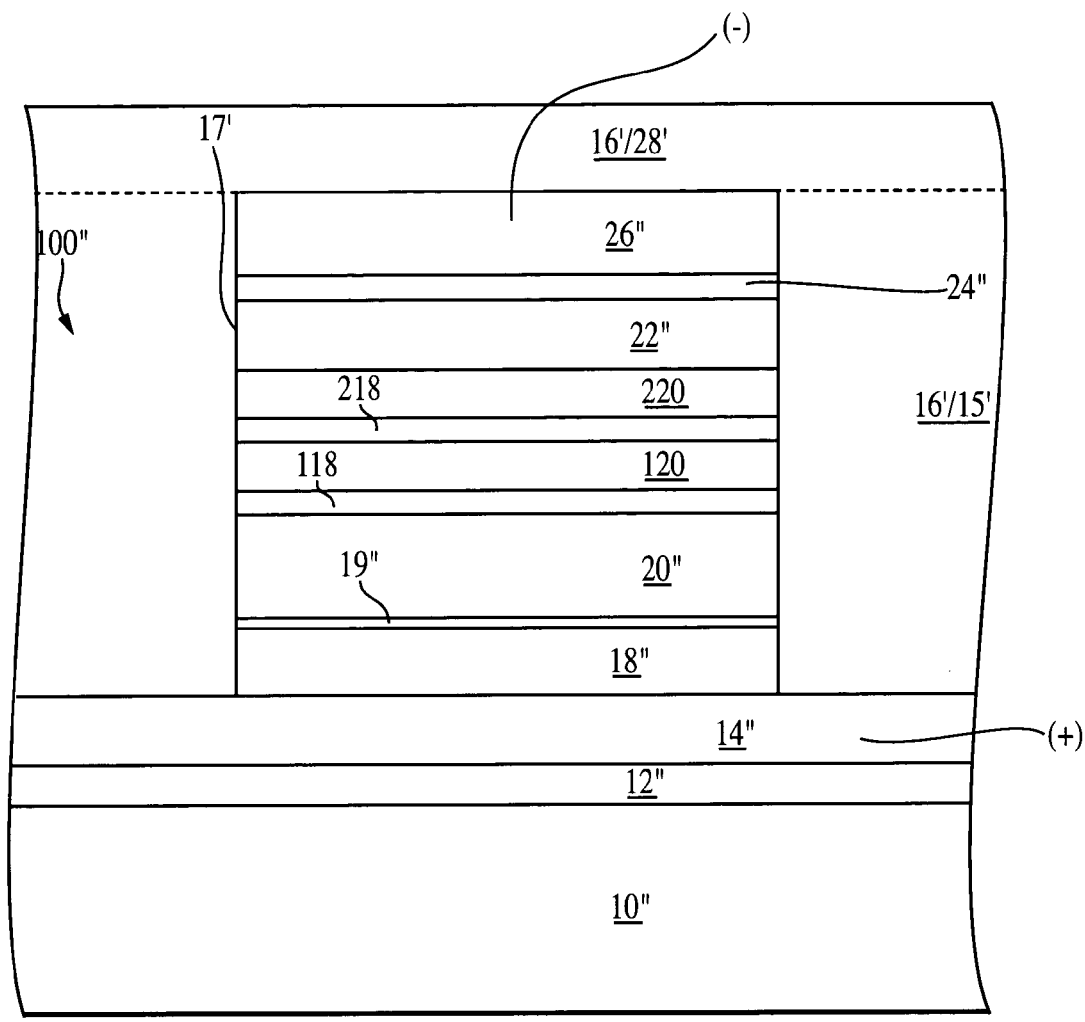
FIG. 18 shows a device in accordance with another embodiment of the invention.

Another embodiment of the invention is shown in FIG. 18. This device 100" can be formed by a process similar to either embodiment described above (i.e., blanket deposition of layers or in-via processing). If the blanket deposition processing of the first embodiment is utilized, insulating layer 16' is utilized. If the in-via processing of the second embodiment is utilized, dielectric layer 15' and insulating layer 28' are utilized. In this third embodiment, additional chalcogenide-based glass layers 118 and 218 are formed alternating with additional metal-chalcogenide layers 120, 220 to form a portion of the resistance variable region of the device 100". These additional alternating layers 118, 120, 218, 220 can be formed with the same processing steps discussed for respective layers 18 and 20 in the previous embodiments and can have the same material composition and physical dimensions. Further, this embodiment is not limited to only the number of additional alternating layers of glass layers 118, 218 and metal-chalcogenide layers 120, 220 shown, but additional such alternating layers can be added as well if desired or found to be appropriate.

Regardless of which processing embodiment described above or which ultimate structure for the device 100, 100', or 100" is fabricated, during processing, either before or after the device is substantially complete, a variety of steps can be utilized to induce the DNR memory effect in the structure to activate the memory element of the devices 100, 100', and 100" so that they will thereafter function by exhibiting DNR memory behavior as illustrated in FIG. 1a. Any of the following DNR inducement methods can be used whether the device is used as a digital memory or analog memory. The following methods of inducting the DNR effect result in making the device silver-rich (or copper-rich if that is the metal of choice). A silver-rich device incorporates greater than about 30% silver into the bottom chalcogenide-based glass layer 4, 18, 18', and 18". Preferably, about 30% to about 53% silver is incorporated into a silver-rich device in this way.

A first method of inducing DNR behavior is accomplished by ensuring saturation (e.g., at least 30% doping of the resistance variable region) of the device with silver by depositing an optional silver layer, e.g., layer 5 or 19, over the first chalcogenide-based glass layer, e.g., layer 4 or 18, during processing. The optional silver layer (e.g., 5 or 19) can be absorbed into the chalcogenide-based layer upon subsequent processing (e.g., forming layer 20) or by photodissolution or thermal diffusion prior to subsequent processing. If the optional silver layer is excluded and instead the top electrode (e.g., layer 6 or 26) comprises metal to be diffused into the resistance variable region, the device stack can be annealed at 100° C. for about 1 hour. Another means of making the DNR structure silver-rich when the metal-chalcogenide layer 20 is $Ag_2Se$ is to make that layer thicker, e.g., up to about 250 Å to about 400 Å thick. Either of these methods can also incorporate a brief annealing process, e.g., heating the structure to about 200° C. for about 5 minutes, preferably in an inert ambient, upon forming the metal-chalcogenide layer 20 or after completion of the device.

Figure 9:
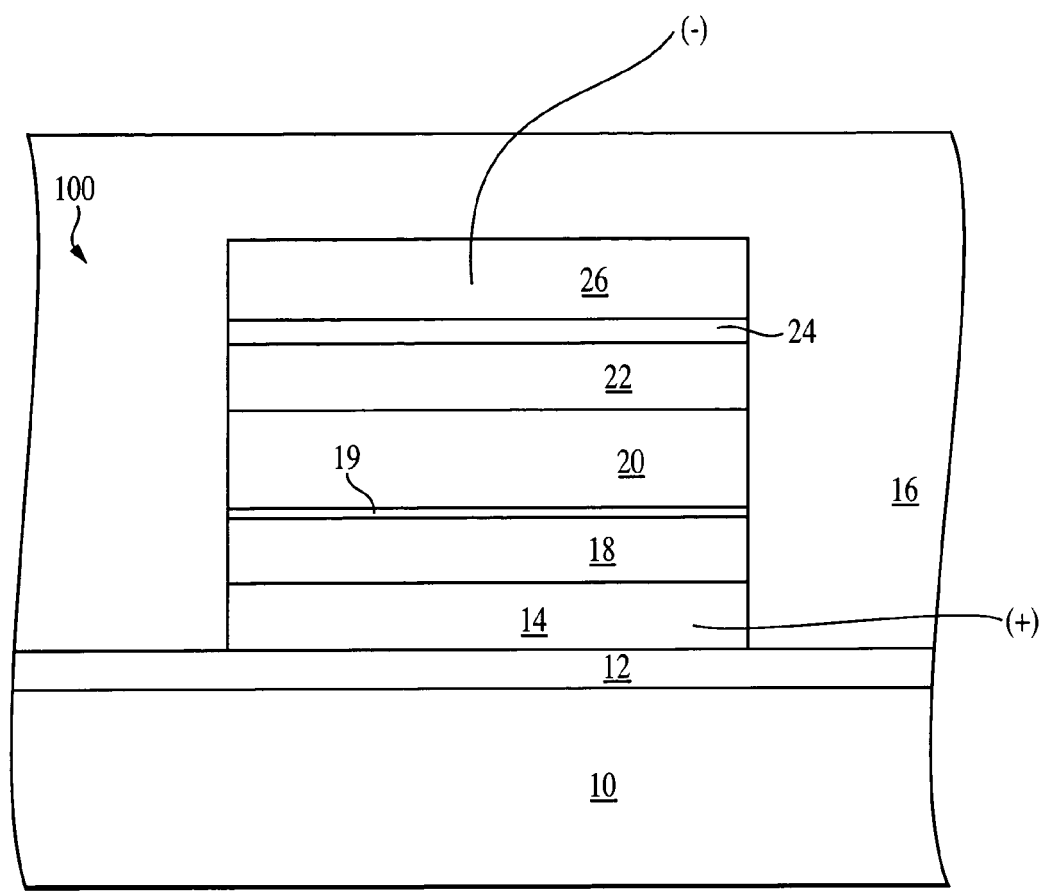

In an alternative embodiment, the DNR effect can be induced by annealing the structure after the device is substantially structurally complete, as shown by device 8, 100, 100', and 100" in FIGS. 9, 17, and 18, respectively. This achieves movement of silver from at least one of the overlying layers, e.g., 5, 19, 20, 22, 24, or 26, into the bottom chalcogenide-based glass layer, e.g., 4 or 18. The annealing parameters depend somewhat on the stoichiometry of the layers, e.g., layers 18, 20, and 22, but in general fall within a defined range. If the device incorporates glass layers (e.g., 18 and 22) having $Ge_{40}Se_{60}$ stoichiometry the DNR behavior can be induced by annealing the structure at about 50° C. for about 60 minutes. If the device is not especially silver-rich, it can be annealed at about 150° C. for about 30 minutes. If the device includes glass layers (e.g., 18 and 22) with $Ge_{25}Se_{75}$ stoichiometry it can be annealed at about 100° C. for about 60 minutes to induce the DNR behavior; this is particularly effective if the top conductive layer, e.g., layer 26, comprises silver or if the optional metal layer, e.g., layer 24, is utilized and is silver. In general, if annealing is the method of inducing the DNR behavior in the device, anneal parameters in the range of about 50° C. to about 150° C. and about 1 minute to about 60 minutes are preferred.

A third alternative for inducing DNR behavior in the memory device is by application of an AC voltage potential to the device at the top electrode (e.g., layer 6 or 26). This also causes migration of silver into the bottom chalcogenide-based glass layer. The negative voltage amplitude of the AC pulse will depend on the thickness of the bottom chalcogenide-based glass layer 4, 18, 18' and 18" and on the pulse width. For instance, for a shorter pulse width a higher amplitude is necessary to convert the cell into a DNR memory. Voltage pulses in the range of about –500 mV to about –2 V for about 5 ns to about 500 ns can be used. Preferably a voltage of about –1 V for about 10 ns is used to induce the DNR behavior. The DNR-inducing voltage pulse can be performed once a completed device (see FIGS.

1, 9, 17, and 18) is connected to a voltage source. The pulse alters the electrical nature of the device and inducing subsequent DNR behavior therein. After the initial inducement of DNR behavior in a completed device (by any of the just described methods), the device will permanently function with the DNR memory effect upon application of the first and second memory states potentials at the top electrode, as shown in FIG. 1a.

Figure 19:
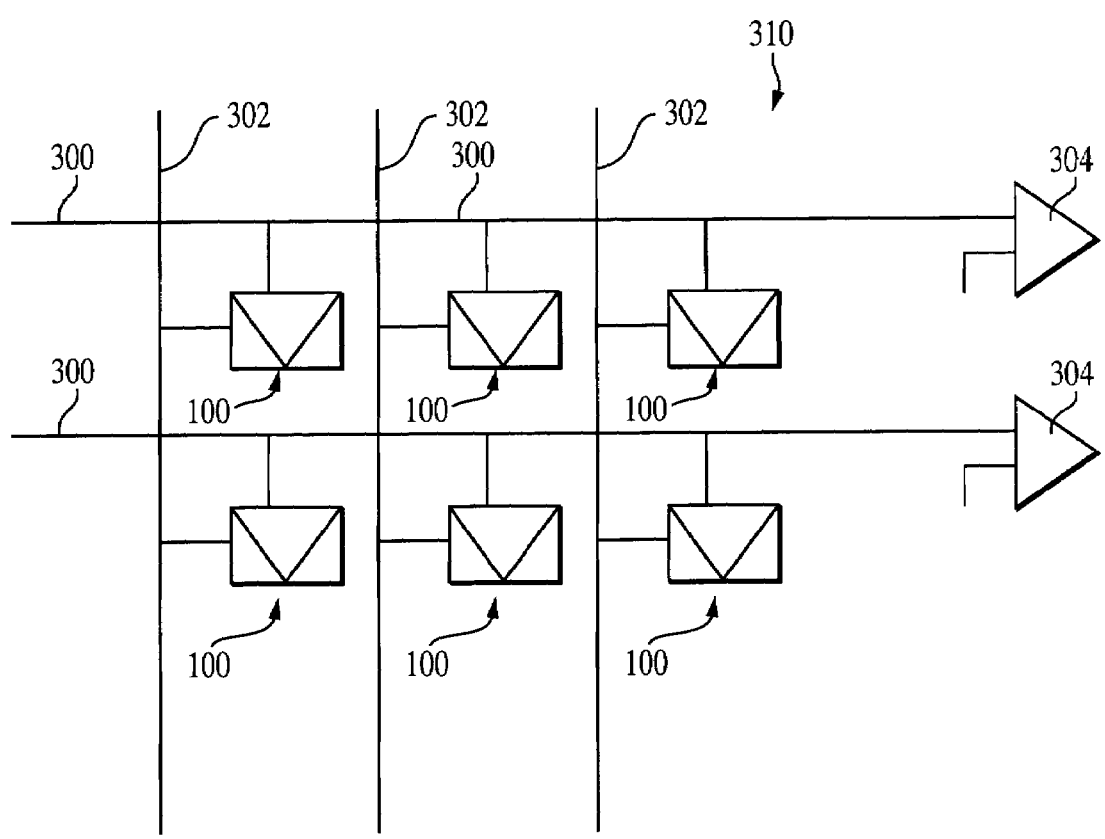
FIGS. 19 through 21 depict portions of memory arrays in accordance with the invention.

Now referring to FIG. 19, the memory device 100 (shown for exemplary purposes) can be incorporated into an array 310 as shown. For the sake of clarity only a portion of the array 310 is shown; however, the array can consist of M×N memory cells having memory devices 100, as desired. The memory device 100 can be addressed at the intersection of a column line 300 and a row line 302. The row line 302 can link each device 100 in electrical connection therewith to a sensing device 304 for reading the information stored in the device as a designated current amplitude. The sensing device 304 can be a sense amplifier tuned to current amplitudes of the selected read voltage of FIG. 1a.

Figure 20:
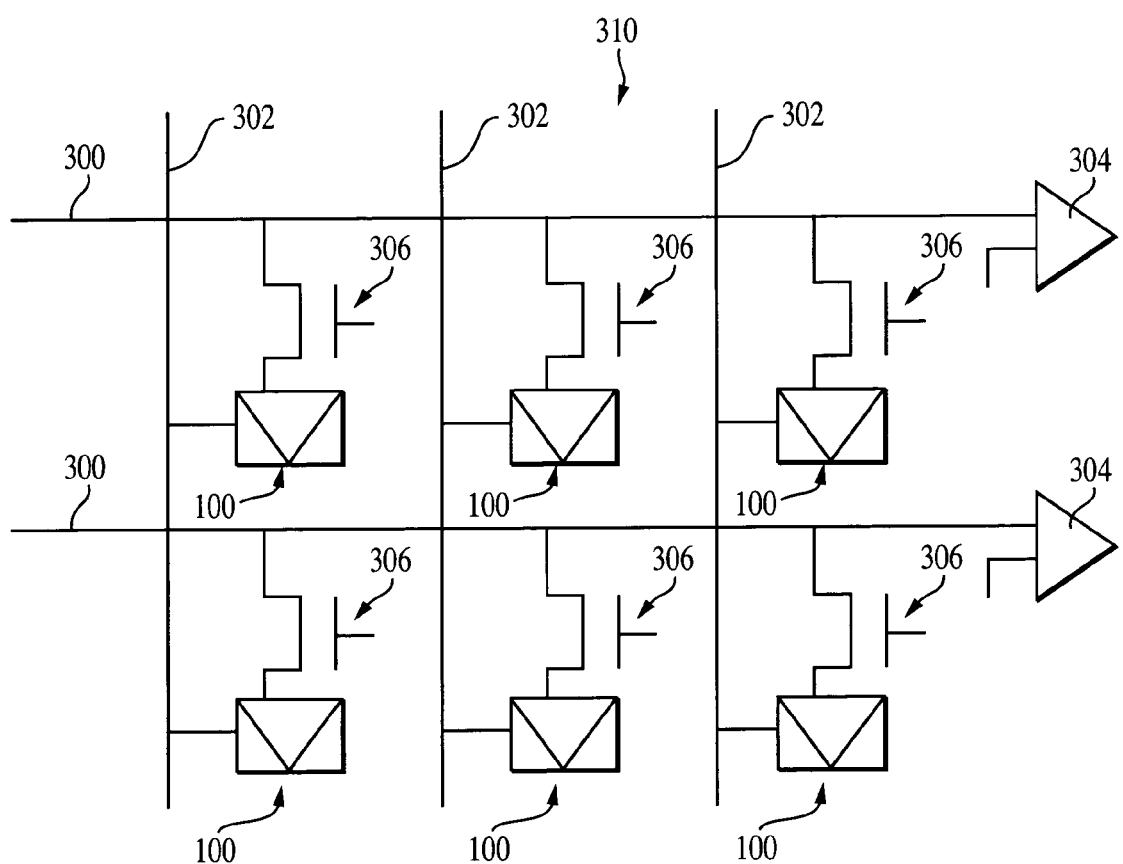

An alternative embodiment is shown in the partial array 310 of FIG. 20. Access transistors 306 can be utilized at each memory device 100. The access transistors 306 can be fabricated and structured as is known in the art and can be positioned anywhere convenient to the memory devices 100. Otherwise the array 310 of FIG. 20 is structured and functions like that shown by FIG. 19.

Figure 21:
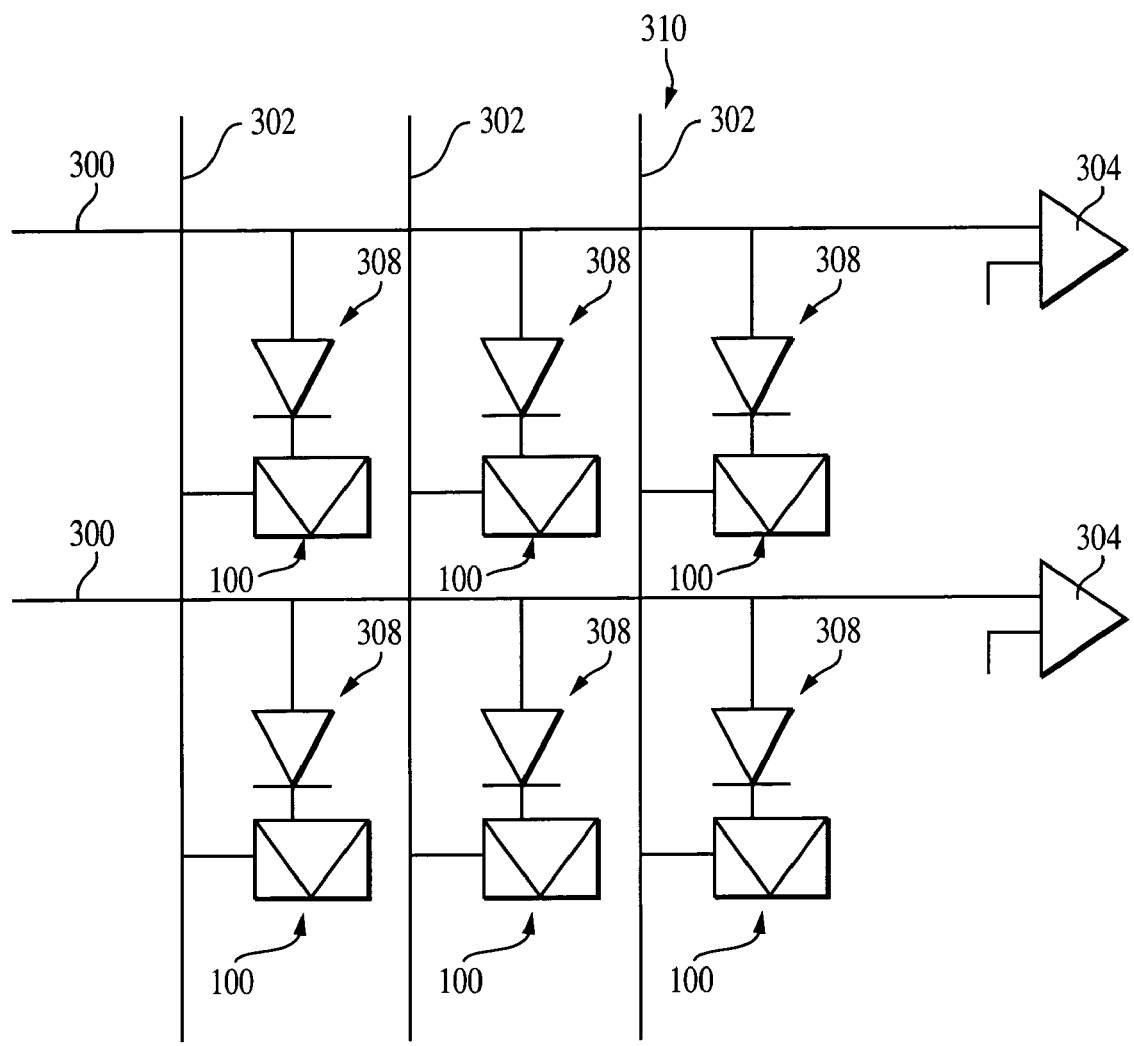

Another embodiment is shown in FIG. 21 where, instead of access transistors 306, isolation diodes 308 are utilized to access the memory devices 100. The diodes 308 can be fabricated and structured as is known in the art and can be positioned anywhere convenient to the memory devices 100, even incorporated into the device 100 itself as layers thereof. Otherwise, the array 310 of FIG. 21 is structured and functions like that shown by FIG. 19. The array 310 shown by FIGS. 19–21 can be utilized whether the memory devices are digital or analog.

Figure 22:
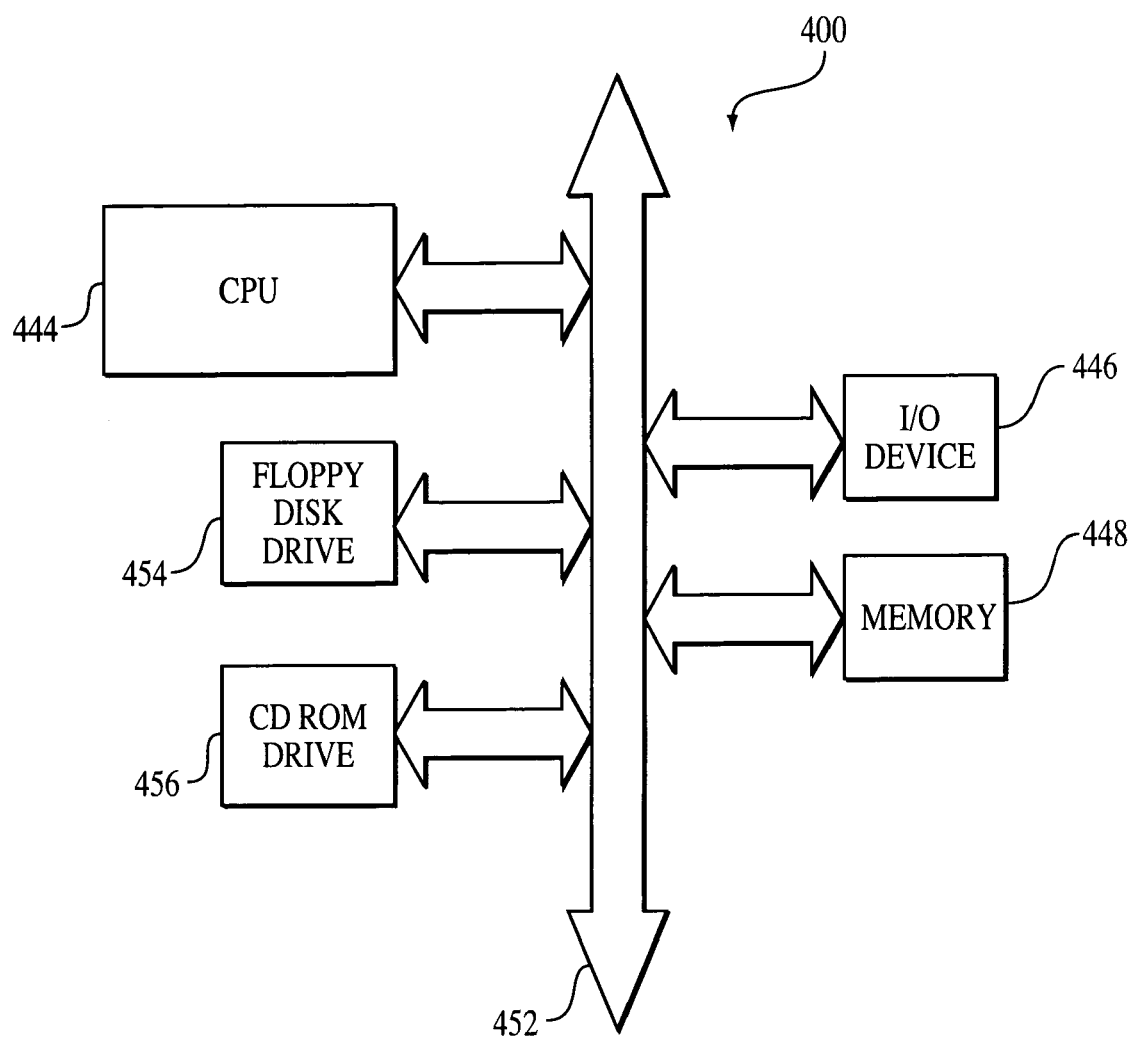
FIG. 22 is a depiction of a system incorporating devices in accordance with the invention.

FIG. 22 shows a typical processor-based system 400, which includes a memory circuit 448, for example, a programmable RAM, employing devices 8, 100, 100', or 100", in accordance with the invention. A processor system, such as computer system, generally comprises a central processing unit (CPU) 444, such as a microprocessor, a digital signal processor, or other programmable digital logic devices. Such devices communicate with an input/output (I/O) device 446 over a bus 452. The memory 448 communicates with the system over the bus 452, typically by a memory controller.

In the case of a computer system, the processor may include peripheral devices, such as a disk drive 454 and a CDROM drive 456, which also communicate with the CPU 444 over the bus 452. Memory 448 is preferably constructed as an integrated circuit, which includes one or more memory devices. If desired, the memory 448 may be combined with the processor, for example CPU 444, in a single integrated circuit.

The processes and devices described above are merely illustrative of but a few of the preferred methods and typical devices that could be used and produced in accordance with the invention. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed is:

1. A differential negative resistance memory device, comprising:
   a first electrode and a second electrode; and
   a resistance variable region separating said first and second electrodes and in electrical communication therewith, said resistance variable region configured to exhibit differential negative resistance memory behavior and configured to store at least one memory state as a read current amplitude in response to applied voltage.

2. The differential negative resistance memory device of claim 1, wherein a first read current amplitude can be written to said memory device upon application of a first voltage potential and a second read current amplitude state can be written to said memory device upon application of a second voltage potential.

3. The differential negative resistance memory device of claim 1, wherein said read current amplitude is sensed upon application of a read voltage to said device.

4. The differential negative resistance memory device of claim 2, wherein said first and second read current amplitudes can be sensed upon application of a read voltage potential.

5. The differential negative resistance memory device of claim 4, wherein said read voltage is lower than said first and second voltage potentials.

6. The differential negative resistance memory device of claim 4, wherein said read voltage potential is about 0.26 V.

7. The differential negative resistance memory device of claim 4, wherein said read voltage potential is up to about 0.36 V.

8. The differential negative resistance memory device of claim 1, wherein said memory behavior is semi-volatile.

9. The differential negative resistance memory device of claim 1, wherein data written to said memory device is retained for at least about a minute without refreshing.

10. The differential negative resistance memory device of claim 1, wherein said first read current amplitude is increased relative to a non-programmed current amplitude when read.

11. The differential negative resistance memory device of claim 1, wherein said second read current amplitude is decreased relative to an non-programmed current amplitude when read.

12. The differential negative resistance memory device of claim 2, wherein one of said first and second voltage potentials is in the range of about 0.36 V to about 0.55 V.

13. The differential negative resistance memory device of claim 2, wherein one of said first and second voltage potentials is in the range of about 0.55 V to about 0.74 V.

14. The differential negative resistance memory device of claim 2, wherein one of said first and second voltage potentials is in the range of about 0.74 V to about 1.0 V.

15. The differential negative resistance memory device of claim 2, wherein one of said first and second voltage potentials is greater than about 1.0 V.

16. The differential negative resistance memory device of claim 1, wherein said memory device is programmable to said at least one memory state in 8 ns or less.

17. The differential negative resistance memory device of claim 1, wherein said memory device is resettable by applying about 2.0 V to said device.

18. The differential negative resistance memory device of claim 1, wherein said resistance variable region comprises at least one layer of $Ge_xSe_{100-x}$, wherein x is about 18 to about 43.

19. The differential negative resistance memory device of claim 1, wherein said resistance variable region comprises a layer of $Ge_{40}Se_{60}$, a layer of $Ag_2Se$ thereover, a layer of $Ge_{40}Se_{60}$ thereover, and a layer of Ag thereover.

20. The differential negative resistance memory device of claim 1, wherein said resistance variable region comprises a layer of $Ge_{25}Se_{75}$ and a layer of Ag thereover.

21. The differential negative resistance memory device of claim 1, wherein said resistance variable region comprises a layer of germanium selenide doped with silver.

22. The differential negative resistance memory device of claim 21, wherein said resistance variable region is in electrical contact with an electrode comprising silver.

23. The differential negative resistance memory device of claim 1, comprising:
a substrate supporting said first electrode;
a first chalcogenide glass layer over said first electrode;
a metal-chalcogenide layer over said first chalcogenide glass layer;
a second chalcogenide glass layer over said metal-chalcogenide layer; and, said second electrode over said second chalcogenide glass layer.

24. The differential negative resistance memory device of claim 23, wherein at least one of said first and second chalcogenide glass layers comprises germanium selenide.

25. The differential negative resistance memory device of claim 24, wherein said germanium selenide has a stoichiometry of $Ge_xSe_{100-x}$.

26. The differential negative resistance memory device of claim 25, wherein x is in the range of about 18 to about 43.

27. The differential negative resistance memory device of claim 26, wherein x is 20.

28. The differential negative resistance memory device of claim 26, wherein x is 25.

29. The differential negative resistance memory device of claim 26, wherein x is 40.

30. The differential negative resistance memory device of claim 23, wherein said metal-chalcogenide layer comprises $Ag_2Se$.

31. The differential negative resistance memory device of claim 23, wherein said metal-chalcogenide layer is about 1 to about 5 times as thick as said first chalcogenide glass layer.

32. The differential negative resistance memory device of claim 23, wherein said metal-chalcogenide layer is about 2 to about 3.1 times as thick as said first chalcogenide glass layer.

33. The differential negative resistance memory device of claim 23, further comprising a plurality of additional layers, said additional layers alternating between at least one third chalcogenide glass layer and at least one second metal-chalcogenide layer, wherein said additional layers separate said second chalcogenide glass layer and said second electrode.

34. The differential negative resistance memory device of claim 23, further comprising a layer of silver separating said second chalcogenide glass layer and said second electrode.

35. The differential negative resistance memory device of claim 1, wherein said memory device is one of a plurality of like devices of an array.

36. The differential negative resistance memory device of claim 1, wherein said memory device is in electrical communication with an access transistor.

37. The differential negative resistance memory device of claim 1, wherein said memory device is in electrical communication with an isolation diode.

38. A memory device, comprising:
an anode;
a chalcogenide-based region over said anode, said region configured to have at least two programmable and maintainable differential negative resistance read current states;
a cathode over said chalcogenide-based region; and
a sensing device in electrical communication with said chalcogenide-based region, said sensing device being able to sense said at least two read current states as at least two read current states in response to an applied read voltage.

39. The memory device of claim 38, wherein said memory device is programmed to a first read current state by application of a first voltage potential and to a second read current by application of a second voltage potential.

40. The memory device of claim 38, wherein said memory device can be programmed to more than two read current states by application of respective voltage potentials.

41. The memory device of claim 38, wherein said read current states are semi-volatile.

42. The memory device of claim 38, wherein a read current state written to said memory device is retained for at least a minute without refreshing.

43. The memory device of claim 39, wherein said first read current state is increased relative to a non-programmed read current at said read voltage.

44. The memory device of claim 39, wherein said second read current state is decreased relative to a non-programmed read current at said read voltage.

45. A processor system, comprising;
a processor;
a differential negative resistance memory device, said memory device comprising;
a first electrode and a second electrode; and
a resistance variable region separating said first and second electrodes and in electrical communication therewith, said resistance variable region configured to exhibit differential negative resistance memory behavior and configured to store at least one memory state as a read current amplitude in response to applied voltage.

46. The processor system of claim 45, wherein said memory device can be programmed to a first read current state upon application of a first voltage potential and to a second read current state upon application of a second voltage potential.

47. The processor system of claim 45, wherein said at least one memory state is semi-volatile.

48. The processor system of claim 45, wherein said at least one memory state written to said memory device is retained for at least a minute without refreshing.

49. The processor system of claim 46, wherein said first read current state is increased relative to a non-programmed read current at a read voltage.

50. The processor system of claim 46, wherein said second read current state is decreased relative to a non-programmed read current at a read voltage.

* * * * *